(12) United States Patent
Alam et al.

(10) Patent No.: US 12,367,385 B2
(45) Date of Patent: Jul. 22, 2025

(54) UNSUPERVISED LEARNING OF MEMRISTOR CROSSBAR NEUROMORPHIC PROCESSING SYSTEMS

(71) Applicant: University of Dayton, Dayton, OH (US)

(72) Inventors: Md Shahanur Alam, Dayton, OH (US); Chris Yakopcic, Dayton, OH (US); Tarek M. Taha, Centerville, OH (US)

(73) Assignee: UNIVERSITY OF DAYTON, Dayton, OH (US)

( * ) Notice: Subject to any disclaimer, the term of this patent is extended or adjusted under 35 U.S.C. 154(b) by 1034 days.

(21) Appl. No.: 17/384,306

(22) Filed: Jul. 23, 2021

(65) Prior Publication Data
US 2022/0027718 A1    Jan. 27, 2022

Related U.S. Application Data

(60) Provisional application No. 63/055,572, filed on Jul. 23, 2020.

(51) Int. Cl.
| | | |
|---|---|---|
| *G11C 13/00* | (2006.01) | |
| *G06N 3/065* | (2023.01) | |
| *G06N 3/088* | (2023.01) | |

(52) U.S. Cl.
CPC .......... G06N 3/065 (2023.01); G06N 3/088 (2013.01); *G11C 13/0002* (2013.01)

(58) Field of Classification Search
CPC ........ G06N 3/065; G06N 3/088; G06N 3/045; G06N 3/048; G06N 3/084; G11C 13/0002; G11C 2213/77; G11C 11/54
(Continued)

(56) References Cited

U.S. PATENT DOCUMENTS

| | | | | |
|---|---|---|---|---|
| 2016/0371582 | A1* | 12/2016 | Eleftheriou | ............ G06N 3/049 |
| 2017/0011290 | A1* | 1/2017 | Taha | ............ G06N 3/065 |

(Continued)

OTHER PUBLICATIONS

Md Zahangir Alom, Tarek M. Taha, 'Network intrusion detection for cyber security using unsupervised deep learning approaches', National Aerospace and Electronic Conference (NAECON), Jun. 2017.

(Continued)

*Primary Examiner* — Michael T Tran
(74) *Attorney, Agent, or Firm* — Taft Stettinius & Hollister LLP

(57) ABSTRACT

An analog neuromorphic circuit is disclosed having a first and a second memristor crossbar configuration implemented into an autoencoder. The first memristor crossbar configuration includes resistive memories that provide resistance values to each corresponding input voltage applied to the first memristor crossbar configuration to generate first output voltages that are compressed from the input voltages. The second memristor crossbar includes resistive memories that provide resistance values to each corresponding first output voltage applied to the second memristor crossbar configuration to generate second output voltages that are decompressed from the first output voltages. A controller compares the second output voltages to the input voltages to determine if the second output voltages are within a threshold of the input voltages. The controller generates an alert when the second output voltages exceed the threshold from the input voltages thereby indicating that input data associated with the input voltages has not been previously identified.

20 Claims, 17 Drawing Sheets

(58) Field of Classification Search
USPC .......................................... 365/148, 230.06
See application file for complete search history.

(56) References Cited

U.S. PATENT DOCUMENTS

| | | | | |
|---|---|---|---|---|
| 2018/0018559 | A1* | 1/2018 | Yakopcic | G06N 3/065 |
| 2018/0068217 | A1* | 3/2018 | Eleftheriou | G06N 3/049 |
| 2019/0034201 | A1* | 1/2019 | Muralimanohar | H03M 3/50 |
| 2019/0311267 | A1* | 10/2019 | Qin | G06N 3/044 |
| 2020/0117986 | A1* | 4/2020 | Burr | G06F 7/5443 |
| 2021/0342678 | A1* | 11/2021 | Mostafa | G06N 3/063 |
| 2021/0374514 | A1* | 12/2021 | Tsai | G06N 3/045 |

OTHER PUBLICATIONS

P. K. Prajapati and M. Dixit, "Un-Supervised MRI Segmentation using Self Organised Maps," International Conference on Computational Intelligence and Communication Networks, pp. 471-474, India, Dec. 2016.

Raghavendra Chalapathy, Sanjay Chawla, "Deep Learning for Anomaly Detection: A Survey", arXiv:1901.03407v2 [cs.LG], Jan. 2019.

L. O. Chua, "Memristor—The Missing Circuit Element," IEEE Transactions on Circuit Theory, vol. 18, No. 5, pp. 507-519 (1971).

T. M. Taha, R. Hasan, C. Yakopcic, and M. R. McLean, "Exploring the Design Space of Specialized Multicore Neural Processors," IEEE/INNS International Joint Conference on Neural Networks (IJCNN), pp. 1-8, Dallas, TX, Aug. 2013.

R. Hasan, T. M. Taha, and C. Yakopcic, "On-chip Training of Memristor Crossbar Based Multi-layer Neural Networks," Microelectronics Journal, vol. 66, No. 8, pp. 31-40, Aug. 2017.

Yakopcic and T. M. Taha, "Analysis and Design of Memristor Crossbar Based Neuromorphic Intrusion Detection Hardware," IEEE/INNS International Joint Conference on Neural Networks (IJCNN), pp. 1-7, Rio de Janeiro, Brazil, Jul. 2018.

Raqibul Hasan and Tarek M. Taha, "Enabling Back Propagation Training of Memristor Crossbar Neuromorphic Processors", International Joint Conference on Neural Networks (IJCNN), Beijing, Jul. 2014.

B. R. Fernando, R. Hasan and M. Tarek Taha, "Low Power Memristor Crossbar Based Winner Takes All Circuit," 2018 IJCNN, Rio de Janeiro, 2018, pp. 1-6.

V. Nikulin, 'Threshold-based clustering with merging and regularization in application to network intrusion detection', Computational Statistics & Data Analysis vol. 51, pp. 1184-1196, Nov. 2006.

A. Laszka, W. Abbas, S. S. Sastry, Yevgeniy Vorobeychik, Xenofon Koutsoukos, 'Optimal Thresholds for Intrusion Detection Systems', Proceeding of the Symposium and Bootcamp on the Science of Security, Pittsburgh, Pennsylvania, USA, Apr. 2016, p. 72-81.

Setareh Roshana, Yoan Michel, Anton Akusokd, Amaury Lendasse, "Adaptive and online network intrusion detection system using clustering and Extreme Learning Machines", Journal of the Franklin Institute vol. 355, pp. 1752-1779, Iss. 4, Mar. 2018.

Subutai Ahmada, Alexander Lavina, Scott Purdya, Zuha Agha, "Unsupervised real-time anomaly detection for streaming data", vol. 262, pp. 134-147, Neurocomputing, 2017.

Dromard J., Roudière G., Owezarski P. (2015) Unsupervised Network Anomaly Detection in Real-Time on Big Data. In: Morzy T., Valduriez P., Bellatreche L. (eds) New Trends in Databases and Information Systems. ADBIS 2015. Communications in Computer and Information Science, vol. 539. Springer, Cham.

G. Kathareios, A. Anghel, Akos M, R. Clauberg, M. Gusat, "Catch It If You Can: Real-Time Network Anomaly Detection With Low False Alarm Rates", IEEE International Conference on Machine Learning and Applications, Cancun, Mexico, Dec. 2017.

Cosmin Radu Popa, 'Synthesis of Computational Structures for Analog Signal Processing', Springer Publisher, 2011.

Pavlo Tymoshchuk, Serhii Shatnyi, 'Hardware Implementation Design of Parallelized Fuzzy Adaptive Resonance Theory Neural Network,' 2019 IEEE XVth International Conference on the Perspective Technologies and Methods in MEMS Design, Polyana, Ukraine, Ukraine, Aug. 2019.

Leonardo Enzo Brito da Silva, Islam Elnabarawy, Donald C. Wunsch II, 'A Survey of Adaptive Resonance Theory Neural Network Models for Engineering Applications,' arXiv:1905.11437v1 [cs.NE] May 4, 2019.

Lakhmi C. Jain, Beatrice Lazzerini, Ugur Halici (Eds.), 'Innovations in ART Neural Networks', Springer Publisher, ISBN 978-3-7908-1857-4, 2000.

C. Yakopcic, T. M. Taha, G. Subramanyam, and R. E. Pino, "Memristor SPICE Model and Crossbar Simulation Based on Devices with Nanosecond Switching Time," IEEE International Joint Conference on Neural Networks (IJCNN), Aug. 2013.

Mohamed Elshamy, Hassan Mostafa, Yehya H. Ghallab, and Mohamed Sameh Said, 'A Novel Nondestructive Read/Write Circuit for Memristor-Based Memory Arrays,' IEEE Transaction on VLSI system, vol. 23, Issue: 11, 2648-2656, 2014.

Ngamwitthayanon N., Wattanapongsakorn N., Coit D.W. (2009) Investigation of Fuzzy Adaptive Resonance Theory in Network Anomaly Intrusion Detection. In: Yu W., He H., Zhang N. (eds) Advances in Neural Networks—ISNN 2009. ISNN 2009. Lecture Notes in Computer Science, vol. 5552. Springer, Berlin, Heidelberg.

Sandra Ackerman, 'Discovering the Brain,' Chapter 8, p. 123, National Academy Press, Washington, D.C.1992.

Chenping Hou, Zhi-Hua Zhou, 'One-Pass Learning with Incremental and Decremental Features,' IEEE Transactions on Pattern Analysis and Machine Intelligence, vol. 40, Issue: 11, Nov. 2018.

* cited by examiner

UNSUPERVISED LEARNING OF MEMRISTOR CROSSBAR NEUROMORPHIC PROCESSING SYSTEMS

RELATED APPLICATIONS

The present application is a U.S. Nonprovisional application of U.S. Provisional Application Ser. No. 63/055,572 filed Jul. 23, 2020, the disclosure of which is incorporated by reference in its entirety.

FIELD OF THE INVENTION

This invention relates to neural networks, and more particularly, to systems and methods for implementing resistive memories in an analog neuromorphic circuit.

BACKGROUND OF THE INVENTION

Traditional computing systems use conventional microprocessor technology in that operations are performed in chronological order such that each operation is completed before the subsequent operation is initiated. The operations are not performed simultaneously. For example, an addition operation is completed before the subsequent multiplication operation is initiated. The chronological order of operation execution limits the performance of conventional microprocessor technology. Conventional microprocessor design is limited in how small the microprocessors can be designed, the amount of power that the microprocessors consume, as well as the speed in which the microprocessors execute operations in chronological order. Thus, conventional microprocessor technology is proving insufficient in applications that require significant computational efficiency, such as in image recognition.

It is becoming common wisdom to use conventional neuromorphic computing networks which are laid out in a similar fashion as the human brain. Hubs of computing power are designed to function as a neuron in the human brain where different layers of neurons are coupled to other layers of neurons. This coupling of neurons enables the neuromorphic computing network to execute multiple operations simultaneously. Therefore, the neuromorphic computing network has exponentially more computational efficiency than traditional computing systems.

Conventional neuromorphic computing networks are implemented in large scale computer clusters which include computers that are physically large in order to attain the computational efficiency necessary to execute applications such as image recognition. For example, applications of these large scale computer clusters include rows and rows of physically large servers that may attain the computational efficiency necessary to execute image recognition when coupled together to form a conventional neuromorphic computing network. Such large scale computer clusters not only take up a significant amount of physical space but also require significant amounts of power to operate.

The significant amount of physical space and power required to operate conventional neuromorphic computing networks severely limits the types of applications for which conventional neuromorphic computing networks may be implemented. For example, industries such as biomedical, military, robotics, and mobile devices are industries that cannot implement conventional neuromorphic computing networks due to the significant space limitations in such industries as well as the power limitations. Therefore, an effective means to decrease the space and the power required by conventional neuromorphic computing is needed.

SUMMARY OF THE INVENTION

The present invention provides an analog neuromorphic circuit that implements a first memristor crossbar configuration, a second memristor crossbar configuration, and a controller. The first memristor crossbar configuration includes a first plurality of resistive memories that is configured to provide a first plurality of resistance values to each corresponding input voltage from a plurality of input voltages applied to the first memristor crossbar configuration to generate a first plurality of output voltages. The first plurality of output voltages is compressed from the plurality of input voltages. A second memristor crossbar configuration includes a second plurality of resistive memories that is configured to provide a second plurality of resistance values to each corresponding output voltage form the first plurality of output voltages generated from the first memristor crossbar configuration and applied to the second memristor crossbar configuration to generate a second plurality of output voltages. The second plurality of output voltages is decompressed from the first plurality of output voltages. A controller is configured to compare the second plurality of output voltages to the plurality of input voltages to determine if the second plurality of output voltages is within a threshold of the plurality of input voltages. The controller is also configured to generate an alert when the second plurality of output voltages exceeds the threshold from the plurality of input voltages thereby indicating that input data associated with the plurality of input voltages has not been previously input into the analog neuromorphic circuit.

The present invention also provides a method for implementing a plurality of resistive memories into an autoencoder to compress and then decompress input data to determine if the input data has been previously identified. The method starts with providing a first plurality of resistance values by a first plurality of resistive memories to each corresponding input voltage from a plurality of input voltages applied to a first memristor crossbar configuration generating a first plurality of output voltages. The first plurality of output voltages is compressed form the plurality of input voltages. The method further includes providing a second plurality of resistance values by a second plurality of resistive memories to each corresponding output voltage from the first plurality of output voltages generated from the first memristor crossbar configuration and applied to the second memristor crossbar configuration to generate a second plurality of output voltages. The second plurality of output voltages is decompressed from the first plurality of output voltages. The second plurality of output voltages is compared to the plurality of input voltages to determine if the second plurality of output voltages is within a threshold of the plurality of input voltages. An alert is generated when the second plurality of output voltages exceeds the threshold from the plurality of input voltages thereby indicating that input data associated with the plurality of input voltages has not been previously identified.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

Additionally, the left most digit(s) of a reference number identifies the drawing in which the reference number first appears.

DETAILED DESCRIPTION

Figure 1:
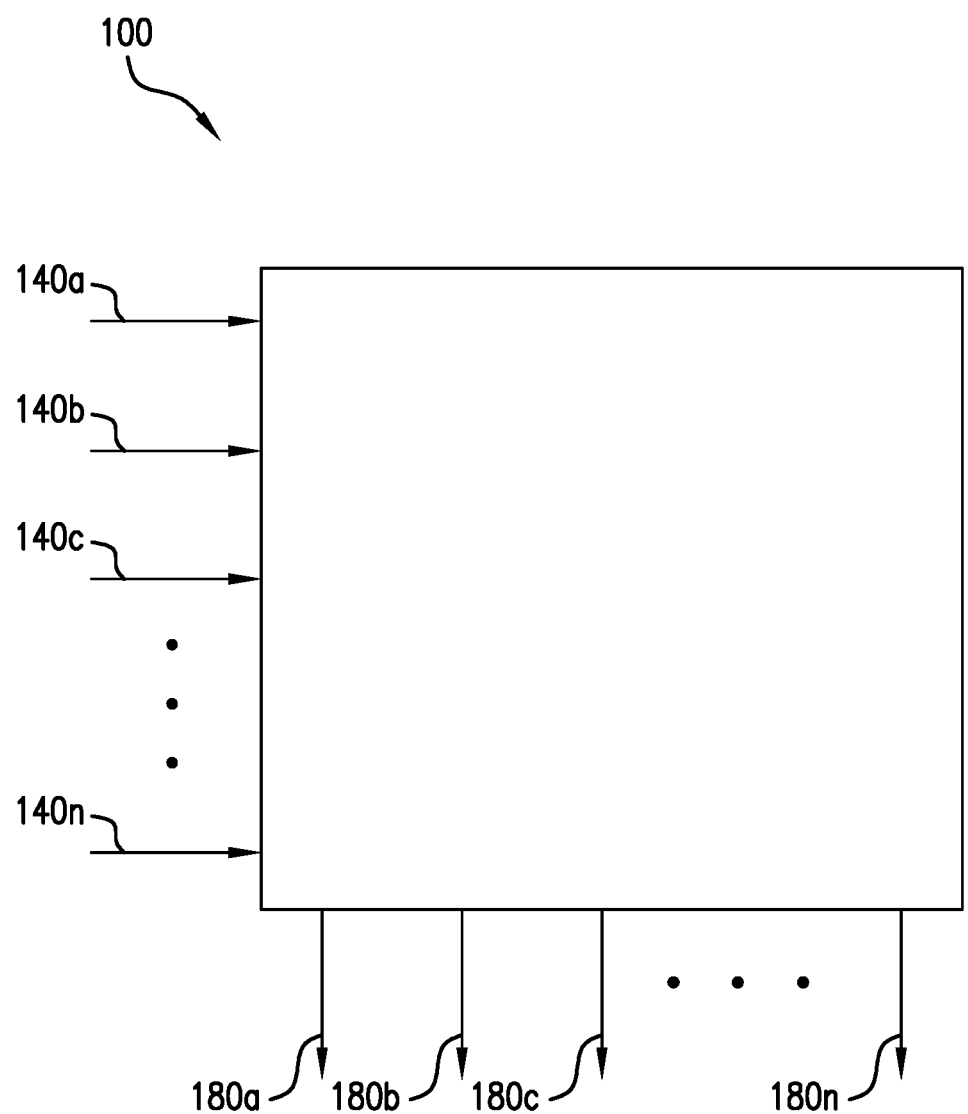
FIG. 1 is a schematic illustration of an exemplary analog neuromorphic processing device that simultaneously executes several computing operations in parallel in accordance with an embodiment of the disclosure.

The following Detailed Description refers to accompanying drawings to illustrate exemplary embodiments consistent with the present disclosure. References in the Detailed Description to "one embodiment," "an embodiment," "an exemplary embodiment," etc., indicate that the exemplary embodiment described can include a particular feature, structure, or characteristic, but every exemplary embodiment does not necessarily include the particular feature, structure, or characteristic. Moreover, such phrases are not necessarily referring to the same embodiment. Further, when a particular feature, structure, or characteristic is described in connection with an embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other embodiments are possible, and modifications can be made to exemplary embodiments within the scope of the present disclosure. Therefore, the Detailed Description is not meant to limit the present disclosure. Rather, the scope of the present disclosure is defined only in accordance with the following claims and their equivalents.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

For purposes of this discussion, each of the various components discussed may be considered a module, and the term "module" shall be understood to include at least one of software, firmware, and hardware (such as one or more circuit, microchip, or device, or any combination thereof), and any combination thereof. In addition, it will be understood that each module may include one, or more than one, component within an actual device, and each component that forms a part of the described module may function either cooperatively or independently of any other component forming a part of the module. Conversely, multiple modules described herein may represent a single component within an actual device. Further, components within a module may be in a single device or distributed among multiple devices in a wired or wireless manner.

The following Detailed Description of the exemplary embodiments will so fully reveal the general nature of the present disclosure that others can, by applying knowledge of those skilled in the relevant art(s), readily modify and/or adapt for various applications such exemplary embodiments, without undue experimentation, without departing from the scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not limitation, such that the terminology or phraseology of the present specification is to be interpreted by those skilled in relevant art(s) in light of the teachings herein.

The present invention creates an analog neuromorphic computing network by implementing resistive memories. A resistive memory is a non-volatile, variable resistor that may not only change the resistance level but may also maintain the resistance level after power to the resistive memory has been terminated so that the resistive memory acts as memory. A combination of resistive memories may generate output values that may be positive and/or negative. Such characteristics of the resistive memory enables neuromorphic computing to be shrunk down from implementing large computers to a circuit that can be fabricated onto a chip while requiring minimal power due to the analog characteristics of the resistive memory.

The resistive memories may be positioned in a crossbar configuration in that each resistive memory is positioned at an intersection of a plurality of horizontal wires and a plurality of vertical wires forming a wire grid. An input voltage may be applied to each horizontal wire. Each resistive memory may apply a resistance to each input voltage so that each input voltage is multiplied by each resistance. The positioning of each resistive memory at each intersection of the wire grid enables the multiplying of each input voltage by the resistance of each resistive memory to be done in parallel. The multiplication in parallel enables multiple multiplication operations to be executed simultaneously. Each current relative to each horizontal wire may then be added to generate an accumulative current that is conducted by each vertical wire. The addition of each current to generate the accumulative currents is also done in parallel due to the positioning of the resistive memories at each intersection of the wire grid. The addition in parallel also enables multiple addition operations to be executed simultaneously. The simultaneous execution of addition and multiplication operations in an analog circuit generates significantly more computational efficiency than conventional microprocessors while implementing significantly less power than conventional microprocessors.

The terms "horizontal" and "vertical" are used herein for ease of discussion to refer to one example of the invention. It should be understood however that such orientation is not required, nor is a perpendicular intersection required. It is sufficient that a plurality of parallel wires intersects a pair of parallel wires to form a crossbar or grid pattern having two wires for adding current and two or more wires for inputting voltages, with a resistive memory positioned at each intersection for multiplication. The intersections may occur at rights angles (orthogonal crossing lines) or non-right angles. It may be understood, however, that the orthogonal arrangement provides the simplest means for scaling the circuit to include additional neurons and/or layers of neurons. Further, it may be understood than an orientation having horizontal rows and/or vertical columns is also simpler for scaling purposes and is a matter of the point of reference, and should not be considered limiting. Thus, any grid configuration orientation is contemplated.

Referring to FIG. 1, an analog neuromorphic processing device 100 simultaneously executes several computing operations in parallel. The analog neuromorphic processing device 100 includes a plurality of input voltages 140(a-n) that are applied to a plurality of respective inputs of the analog neuromorphic processing device 100 and the analog neuromorphic processing device 100 then generates a plurality of output signals 180(a-n).

The analog neuromorphic processing device 100 may include a plurality of resistive memories (not shown) that have variable resistance characteristics that may be exercised not only with low levels of power but may also exercise those variable resistance characteristics after power applied to the resistive memories has been terminated. The variable resistance characteristics of the resistive memories enable the resistive memories to act as memory while maintaining significantly low power requirements compared to conventional microprocessors. The resistive memories are also of nano-scale sizes that enable a significant amount of resistive memories to be configured within the analog neuromorphic processing device 100 while still maintaining significantly low power level requirements. The variable resistance capabilities of the resistive memories coupled with the nano-scale size of the resistive memories enable the resistive memories to be configured so that the analog neuromorphic processing device 100 has significant computational efficiency while maintaining the size of the analog neuromorphic processing device 100 to a chip that may easily be positioned on a circuit board.

For example, the resistive memories may include but are not limited to memristors that are nano-scale variable resistance devices with a significantly large variable resistance range. The physics of the resistive memories, such as memristors, require significantly low power and occupy little space so that the resistive memories may be configured in the analog neuromorphic processing device 100 to generate significant computational efficiency from a small chip.

The plurality of input voltages 140(a-n), where n is an integer greater than or equal to one, may be applied to corresponding inputs of the analog neuromorphic processing device 100 to exercise the variable resistance characteristics of the resistive memories. The input voltages 140(a-n) may be applied at a voltage level and for a time period that is sufficient to exercise the variable resistance characteristics of the resistive memories. The input voltages 140(a-n) may vary and/or be substantially similar depending on the types of variable resistance characteristics that are to be exercised by each of the resistive memories.

The resistive memories may be arranged in the analog neuromorphic processing device 100 such that the resistive memories may simultaneously execute multiple addition and multiplication operations in parallel in response to the input voltages 140(a-n) being applied to the inputs of the analog neuromorphic processing device 100. The variable resistance characteristics of the resistive memories as well as their nano-scale size enables a significant amount resistive memories to be arranged so that the input voltages 140(a-n) trigger responses in the resistive memories that are then propagated throughout the analog neuromorphic processing device 100 that results in simultaneous multiplication and addition operations that are executed in parallel.

The simultaneous multiplication and addition operations executed in parallel exponentially increases the efficiency of analog neuromorphic processing device 100 while limiting the power required to obtain such computation capabilities to the input voltages 140(a-n). The resistive memories are passive devices so that the simultaneous multiplication and addition operations executed in parallel are performed in the analog domain, which also exponentially decreases the required power. For example, the analog neuromorphic processing device 100 may have significantly more computational efficiency than traditional microprocessor devices, and may be smaller than traditional microprocessor chips while reducing power in a range from 1,000 times to 1,000,000 times that of traditional microprocessors.

The resistive memories may also be arranged such that the simultaneous execution of the multiplication and addition operations in parallel may be configured as a single computation hub that constitutes a single neuron in a neural network. The variable resistance characteristics and the nano-scale size of the resistive memories further enable the arrangement of resistive memories to be scaled with other arrangements of resistive memories so that the single neuron may be scaled into a neural network including multiple neurons. The scaling of a single neuron into multiple neurons exponentially further increases the computational efficiency of the resulting neural network. In addition, the multiple neurons may be scaled into several layers of neurons that further exponentially increases the computational efficiency of the neural network. The scaling of the resistive memories into additional neurons may be done within the analog neuromorphic processing device 100 such as within a single chip. However, the analog neuromorphic processing device 100 may also be scaled with other analog neuromorphic circuits contained in other chips to exponentially increase the computational efficiency of the resulting neural network.

As a result, the analog neuromorphic processing device 100 may be configured into a neural network that has the capability of executing applications with significant computational efficiency, such as image recognition. For example, the output signals 180(a-n), where n is an integer greater than or equal to one, may generate signals that correctly identify an image. The analog neuromorphic processing device 100 may also have the learning capability as will be discussed in further detail below so that analog neuromorphic circuits may successfully execute learning algorithms.

The analog neuromorphic processing device 100 implemented as a single neuron and/or multiple neurons in a neural network and/or configured with other similar analog neuromorphic processing device 100 may have significant advantages in traditional computing platforms that require significant computational efficiency with limited power resources and space resources. For example, such traditional computing platforms may include but are not limited to Fast Fourier Transform (FFT) applications, Joint Photographic Experts Group (JPEG) image applications, and/or root mean square (RMS) applications. The implementation of low power neural networks that have a limited physical footprint may also enable this type of computational efficiency to be utilized in many systems that have traditionally not been able to experience such computational efficiency due to the high power consumption and large physical footprint of conventional computing systems. Such systems may include but are not limited to military and civilian applications in security (image recognition), robotics (navigation and environment recognition), and/or medical applications (artificial limbs and portable electronics).

The layering of the analog neuromorphic processing device 100 with other similar analog neuromorphic circuits may enable complex computations to be executed. The compactness of the resistive memory configurations enables fabrication of chips with a high synaptic density in that each chip may have an increased amount of neurons that are fitted onto the chip. The passive characteristics of the resistive memories eliminate the need for software code which increases the security of the analog neuromorphic processing device 100.

Figure 2:
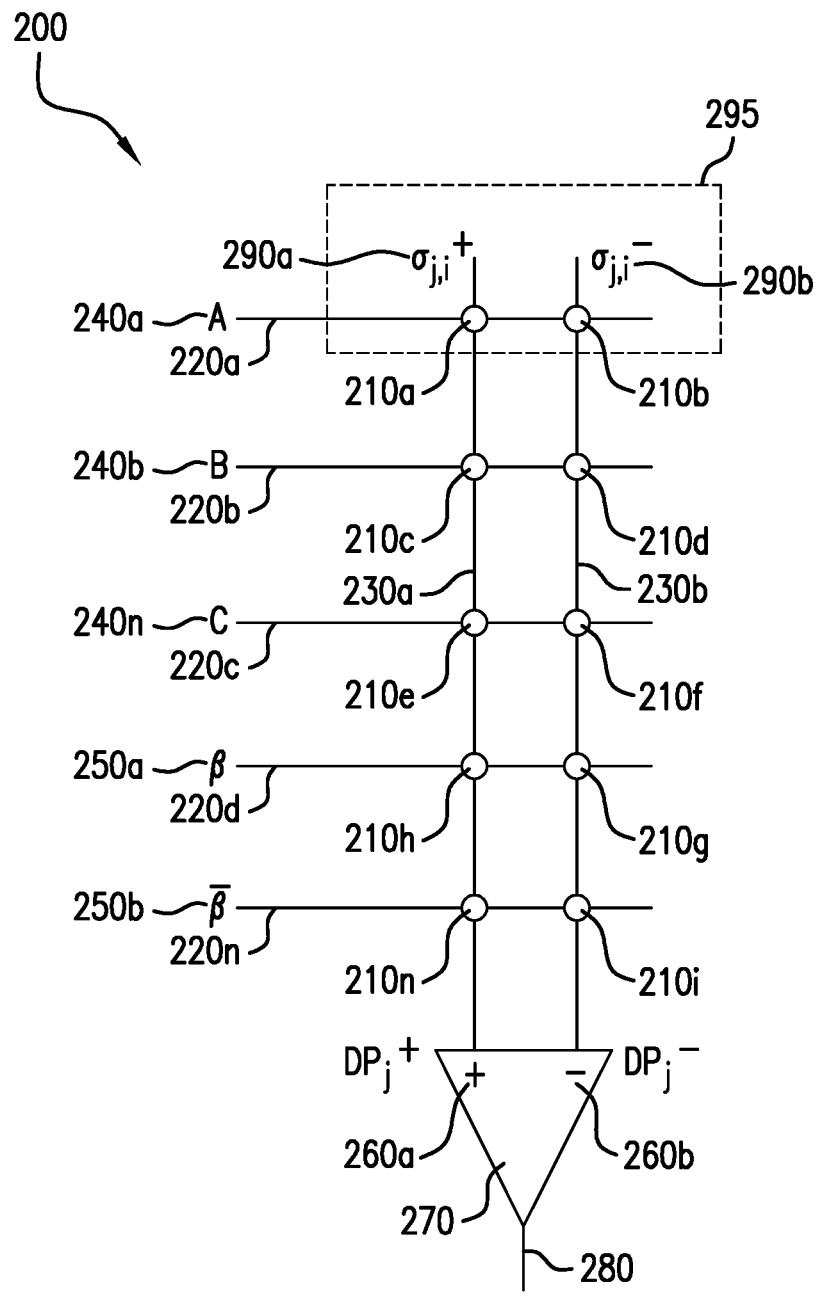
FIG. 2 is a schematic illustration of an exemplary analog neuromorphic circuit that simultaneously executes several computing operations in parallel in accordance with an embodiment of the disclosure.

Referring to FIG. 2, an analog neuromorphic circuit 200 simultaneously executes several computing operations in parallel. The analog neuromorphic circuit 200 includes a plurality of resistive memories 210(a-n) where n is an integer equal to or greater than four, a plurality of horizontal wires 220(a-n) where n is an integer equal to or greater than two, a pair of vertical wires 230(a-b), a plurality of input voltages 240(a-n) where n is an integer equal to or greater than two, a pair of bias voltage connections 250(a-b), a first and second input of a comparator 260(a-b), a comparator 270, an output of the comparator 280, a pair of weights 290(a-b), and a combined weight 295. The analog neuromorphic circuit 200 shares many similar features with the analog neuromorphic processing device 100; therefore, only the differences between the analog neuromorphic circuit 200 and the analog neuromorphic processing device 100 are to be discussed in further detail.

The analog neuromorphic circuit 200 may be representative of a single neuron of a neural network. The analog neuromorphic circuit 200 has the capability to be scaled to interact with several other analog neuromorphic circuits so that multiple neurons may be implemented in the neural network as well as creating multiple layers of neurons in the neural network. Such a scaling capability to include not only multiple neurons but also multiple layers of neurons significantly magnifies the computational efficiency of the neural network, as will be discussed in further detail below.

The resistive memories 210(a-n) may be laid out in a crossbar configuration that includes a high density wire grid. The crossbar configuration enables the resistive memories 210(a-n) to be tightly packed together in the wire grid as will be discussed in further detail below. The tightly packed resistive memories 210(a-n) provides a high density of resistive memories 210(a-n) in a small surface area of a chip such that numerous analog neuromorphic circuits may be positioned in a neural network on a chip while occupying little space. The crossbar configuration also enables the resistive memories 210(a-n) to be positioned so that the analog neuromorphic circuit 200 may execute multiple addition and multiplication operations in parallel in the analog domain. The numerous neuromorphic circuits may then be positioned in the neural network so that the multiple addition and multiplication operations that are executed in parallel may be scaled significantly, thus exponentially increasing the computational efficiency. The resistive memories 210(a-n) are passive devices so that the multiple addition and multiplication operations executed in parallel are done in the analog domain, which also exponentially decreases the required power.

As a result, the analog neuromorphic circuits that are configured into a neural network have the capability of executing applications requiring significant computation power, such as image recognition. The analog neuromorphic circuits also have learning capability as will be discussed in further detail below so that the analog neuromorphic circuits may successfully execute learning algorithms.

Figure 3:
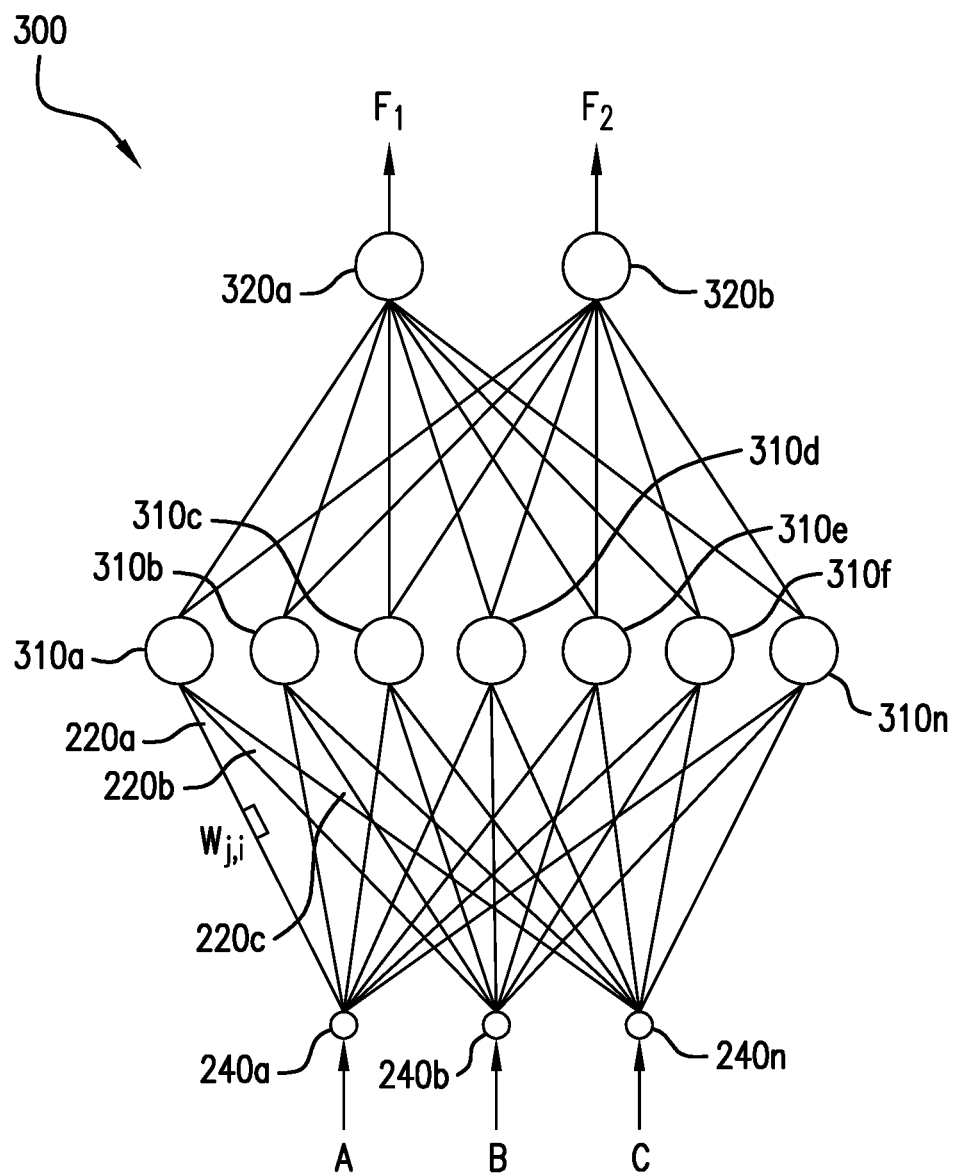
FIG. 3 is a schematic illustration of an exemplary neural network configuration that the analog neuromorphic circuit of FIG. 2 may be implemented and scaled in accordance with an embodiment of the disclosure.

Referring to FIG. 3, in which like reference numerals are used to refer to like parts, neural network configuration 300 that the analog neuromorphic circuit 200 may be implemented and scaled into is shown. The neural network configuration 300 shares many similar features with the analog neuromorphic processing device 100 and the analog neuromorphic circuit 200; therefore, only the differences between the neural network configuration 200 and the analog neuromorphic processing device 100 and the analog neuromorphic circuit 200 are to be discussed in further detail.

The analog neuromorphic circuit 200 may be implemented into the neural network configuration 300. The analog neuromorphic circuit 200 may constitute a single neuron, such as neuron 310a in the neural network configuration 300. As shown in FIG. 3, the input voltage 240a and represented by "A" is applied to the horizontal wire 220a, the input voltage 240b and represented by "B" is applied to the horizontal wire 220b, and the input voltage 240n and represented by "C" is applied to the horizontal wire 220c. The combined weight 295 as shown in FIG. 2 as representative of the combined weight for the input voltage 240a is shown as $W_{j,i}$ in FIG. 3. Similar combined weights for the input voltage 240b and the input voltage 240n may also be represented in FIG. 3 in a similar fashion. The wire grid, the resistive memories 210(*a-n*), and the comparator 270 are represented by the neuron 310a. The output 280 of the analog neuromorphic circuit 200 is coupled to additional neurons 320a and 320b.

The analog neuromorphic circuit 200 may then be scaled so that similar circuits may be configured with the analog neuromorphic circuit 200 to constitute additional neurons, such as neurons 310(*b-n*) where n is an integer greater than or equal to two. Each of the other neurons 310(*b-n*) includes similar circuit configurations as the analog neuromorphic circuit 200. However, the resistances of the resistive memories associated with each of the other neurons 310(*b-n*) may differ from the analog neuromorphic circuit 200 so that outputs that differ from the output 280 of the analog neuromorphic circuit 200 may be generated.

Rather than limiting the input voltages 240(*a-n*) to be applied to a single neuron 310, the input voltages 240(*a-n*) may also be applied to multiple other neurons 310(*b-n*) so that each of the additional neurons 310(*b-n*) also generate outputs that differ from the output 280 generated by the analog neuromorphic circuit 200. The generation of multiple different outputs from the different neurons 310(*a-n*) exponentially increases the computational efficiency of the neural network configuration 300. As noted above, the analog neuromorphic circuit 200 represented by the neuron 310a operates as a single logic function with the type of logic function being adjustable. The addition of neurons 310(*b-n*) provides additional logic functions that also have the capability of their logic functions being adjustable so that the computational efficiency of the neural network configuration 300 is significant.

In addition to having several different neurons 310(*a-n*), the analog neuromorphic circuit 200 may also be scaled to include additional layers of neurons, such as neurons 320 (*a-b*). The scaling of additional layers of neurons also exponentially increases the computational efficiency of the neural network configuration 300 to the extent that the neural network configuration 300 can execute learning algorithms. For example, a neural network configuration with a significant number of input voltages, such as several hundred, that are applied to a significant number of neurons, such as several hundred, that have outputs that are then applied to a significant number of layers of neurons, such as ten to twenty, may be able to execute learning algorithms. The repetitive execution of the learning algorithms by the extensive neural network configuration may result in the neural network configuration eventually attaining automatic image recognition capabilities.

For example, the neural network configuration may eventually output a high voltage value of "$F_1$" representative of the binary signal "1" and output a low voltage value of "$F_2$" representative of the binary signal "0" when the neural network configuration recognizes an image of a dog. The neural network configuration may then output a low voltage value of "$F_1$" representative of the binary signal "0" and output a high voltage value of "$F_2$" representative of the binary signal "1" when the neural network configuration recognizes an image that is not a dog.

Figure 4:
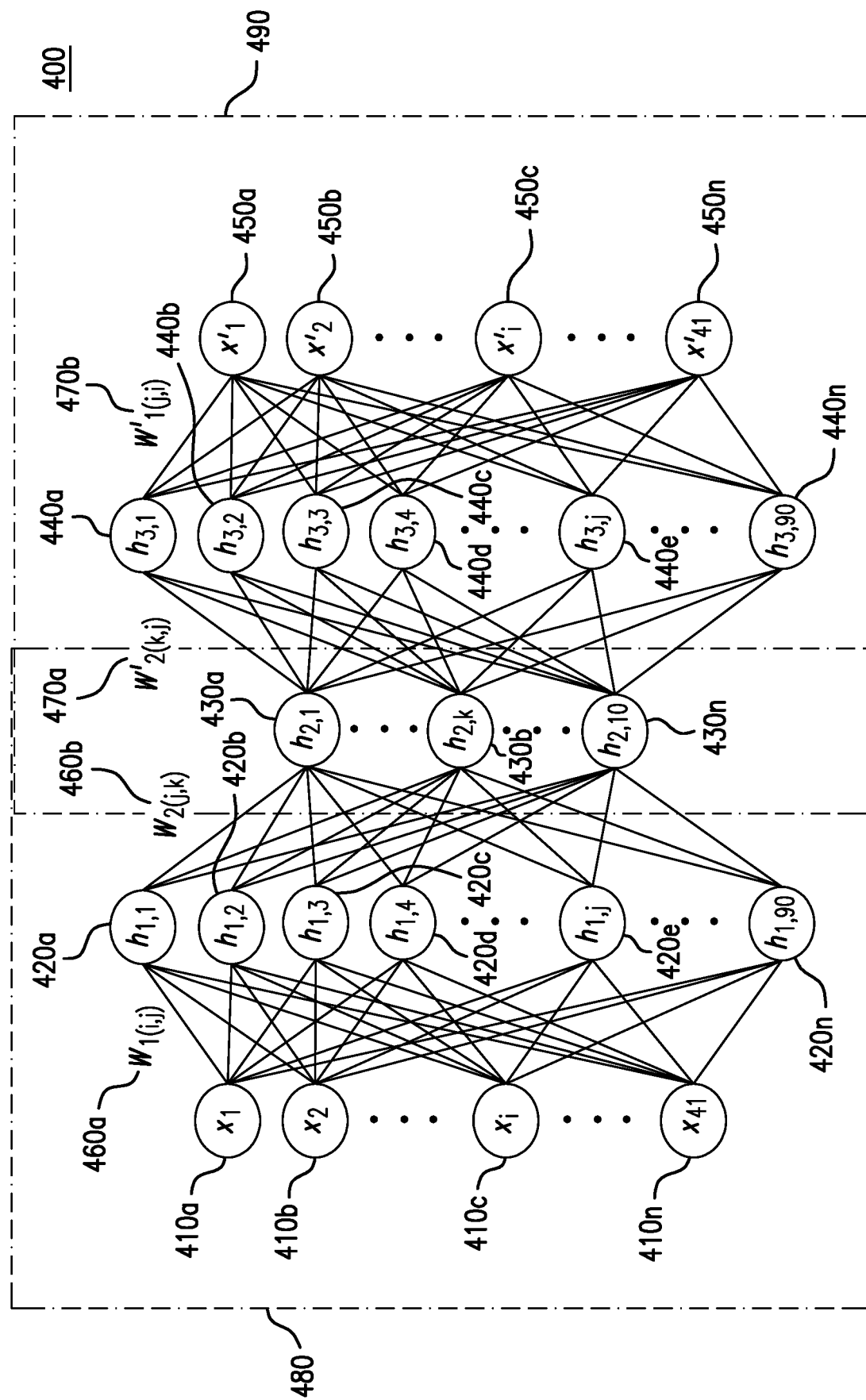
FIG. 4 is a schematic illustration of a detailed neural network detailed autoencoder network configuration implementing analog neuromorphic circuits similar to the analog neuromorphic circuit of FIG. 2 in accordance with an embodiment of the disclosure.

Referring to FIG. 4, in which like reference numerals are used to refer to like parts, a detailed autoencoder network configuration 400 is shown. The autoencoder network configuration 400 shares many similar features with the analog neuromorphic processing device 100, the analog neuromorphic circuit 200, and the neural network configuration 300; therefore, only the differences between the neural network configuration 400 and the analog neuromorphic processing device 100, the analog neuromorphic circuit 200 and the neural network configuration 300 are to be discussed in more detail.

An unsupervised learning neural network may enable the identification of previously unknown events and/or conditions. In numerous applications, the identification of previously unknown events and/or conditions would provide significant value to those applications where such identification of previously unknown events and/or conditions would prevent significant negative impact and/or damage to the health of individuals, communication networks, electronic devices, network security, structures, and so on. Previously unknown events and/or conditions may be represented by a data set that when inputted into the unsupervised learning neural network may be flagged by the unsupervised neural network as being a data set that the unsupervised learning neural network has not seen before and thereby trigger an alert that such a data set that represents the unidentified event and/or condition is a new event and/or condition.

In doing so, simply the identification that the event and/or condition has not been previously identified by the unsupervised neural network may provide notification that corrective action should be taken in response to unidentified event and/or condition to mitigate any negative impact caused by the unidentified event and/or condition. An event and/or a condition may be any type of event and/or condition that may be represented by a data set in which the data set may be input into the unsupervised learning neural network such that the unsupervised learning neural network may determine whether the unsupervised learning neural network identifies the event and/or condition based on the data set associated with the event and/or condition.

For example, a zero day cybersecurity attack is an event and/or a condition that is a cybersecurity attack that has not been previously seen by cybersecurity systems. Until a cybersecurity attack is identified as being a type of cybersecurity attack, conventional cybersecurity systems cannot be prepared to prevent the cybersecurity attack. As a result, the first time a cybersecurity attack that has yet to be seen by conventional cybersecurity systems significantly increases the risk that the previously unknown cybersecurity attack may be successful and negatively impact the network that the cyberattack is attempting to attack. Hence, a zero day cybersecurity attack is a cybersecurity attack that has not been previously identified as being a cybersecurity attack by cybersecurity systems.

Conventional cybersecurity systems struggle to defend against zero day cybersecurity attacks due to conventional cybersecurity systems require supervised learning in order for the conventional cybersecurity systems to be able to identify a cybersecurity attack. Conventional cybersecurity systems are limited to only identifying cybersecurity attacks that the conventional cybersecurity systems have been trained to identify as being cybersecurity attacks. If a conventional cybersecurity system has not been previously trained to identify a specific cybersecurity attack, then the conventional cybersecurity system may fail in identifying any unknown cybersecurity attacks thereby significantly increasing the susceptibility to the network that the conventional cybersecurity system is tasked to protect.

However, the autoencoder neural network configuration 400 may execute unsupervised learning with the implementation of resistive memories to enable the autoenecoder neural network configuration 400 to identify that the data set associated with an event and/or condition that is input into the autoencoder neural network. For example, the autoencoder neural network configuration 400 may identify that the data set associated with a zero day cybersecurity attack is a data set that has yet to be previously identified by the autoencoder neural network 400 as a data set that has been previously input into the autoencoder neural network 400. The identification by the autoencoder neural network 400 that the data set associated with the event and/or condition has not been previously identified by the autoencoder neural network 400 and that the data set associated with the event and/or condition is new enables the autoencoder neural network 400 to provide an alert that a potential zero day cybersecurity attack is occurring so that preventive measures may be executed to protect the network that the autoencoder neural network 400 is protecting.

As a result, the autoencoder neural network configuration 400 that implements resistive memories may enable efficient neural network training in embedded systems while also allowing to for unsupervised learning to be executed on a chip in low power computing devices. In doing so, the autoencoder neural network configuration 400 that implements resistive memories may execute unsupervised learning without requiring user intervention to incorporate supervised learning. For example, the autencoder neural network configuration 400 may identify zero day cyberattacks before the user is able to train other conventional supervised cybersecurity systems to look for and identify such new zero day cyberattacks. The autoencoder neural network configuration 400 may do so while on the chip level thereby enabling placement on numerous applications including while consuming little power further enhancing applications that have low power consumption platforms as well, such as IoT devices. The autoencoder neural network configuration 400 that implements resistive memories may be incorporated into medical devices that monitor individuals, communication networks, electronic devices, network security devices, space devices, IoT devices, structures such as bridges and/or any other type of platform and/or application that requires the identification of previously unknown events and/or conditions with a chip layout and low power consumption that will be apparent to those skilled in the art relevant art(s) without departing from the spirit and scope of the disclosure.

The autoencoder neural network configuration 400 that implements resistive memories is able to identify events and/or conditions that have yet to be previously identified by the autoencoder neural network configuration 400 by determining if the data set associated with the event and/or condition that is input into the autoencoder neural network configuration 400 is within a threshold of the data set that is output from the autoencoder neural network configuration 400. The data set associated with the event and/or condition may be applied to the autoencoder neural network configuration 400 as input data that is applied to a plurality of input neurons 410($a$-$n$), where n is an integer equal to or greater than one, that is an input layer for the autoencoder neural network configuration 400. For example, FIG. 4 depicts that the event and/or condition includes a data set of that is applied to 41 different input neurons 410($a$-$n$) as input data that input into the autoencoder neural network configuration 400 via the 41 different input neurons 410($a$-$n$).

The autoencoder neural network configuration 400 may then extract different features from the input data that is applied to the input neurons 410($a$-$n$) that is associated with the event and/or condition with a plurality of extraction neurons 420($a$-$n$), where n is an integer equal to or greater than one. The extraction neurons 420($a$-$n$) may be a layer of neurons that applies a first weighed matrix to the input data that is applied to the input neurons 410($a$-$n$). The first weighted matrix includes numerous different weights 460($a$-$b$) in which each extraction neuron 420($a$-$n$) is associated with a corresponding weight 460($a$-$b$). Each weight 460($a$-$n$) when applied as an weighted matrix to the input data via the extraction neurons 420($a$-$n$) generates a corresponding value for the input data relative to each corresponding weight 460($a$-$b$) applied via the first weighted matrix represented by the extraction neurons 420($a$-$n$). For example, FIG. 4 depicts that a first weighted matrix that includes the weights 460($a$-$b$) is applied via 90 different extraction neurons 420($a$-$n$) to each of the input neurons 410($a$-$n$) that the input data for the event and/or condition is applied.

In an embodiment, each of the values of the weights 460($a$-$b$) included in the first weighed matrix may be determined by pre-emptively training the autoencoder neural network configuration 400 to recognize known events and/or conditions that have been previously applied to the autoencoder neural network configuration 400. In doing so, the autoencoder neural network configuration 400 is pre-emptively trained to determine the values of the weights 460($a$-$b$) included in the first weighted matrix such that the autenconder neural network configuration 400 is able to identify known events and/or conditions based on the input data associated with such known events and/or conditions are applied to the weights 460($a$-$b$) of the first weighted matrix. In doing so, should the input data associated with such previously known events and/or conditions be applied to the weights 460($a$-$b$) included in the first weighted matrix, the resulting values may be recognized by the autoencorder neural network configuration 400 as known values thereby indicating that the event and/or condition that is applied to the autoencoder neural network configuration 400 is a previously known event and/or condition.

For example, the data set of a known vibration profile of a bridge may be applied to the autoencoder neural network configuration 400 as input data. The vibration profile is a known vibration profile of the bridge and thus the autoencoder neural network configuration 400 is pre-emptively trained to determine the weights 460($a$-$b$) included in the first weighted matrix that when the input data associated with the known vibration profile is input into the autoencoder neural network configuration 400 that the weights 460($a$-$b$) have been pre-emptively determined such that when first weighted matrix is applied to the input data known vibration profile triggers the autoencoder neural network configuration 400 to identify the known vibration profile as being previously applied to the autoencoder neural network 400.

The autoencoder neural network configuration 400 may then compress the result of the first weighted matrix that is applied to the to the input neurons 410($a$-$n$) via the extraction neurons 420($a$-$n$) to a layer of compressed neurons 430($a$-$n$), where n is an integer equal to or equal to or greater than one. For example, FIG. 4 depicts that the application of the first weighted matrix via the 90 compressed neurons 430($a$-$n$) is applied to the input data via the 41 input neurons 410($a$-$n$) is then compressed from the 41 input neurons 410($a$-$n$) to 10 compressed neurons 430($a$-$n$) such that the 10 compressed neurons 430($a$-$n$) are a compressed representation of the first weighted matrix applied to the input data of the 41 input neurons 410($a$-$n$).

The autoencoder neural network configuration 400 may then extract different features from the compressed data via the compressed neurons 430($a$-$n$) with a plurality of extraction neurons 440($a$-$n$), where n is an integer equal to or greater than one. The extraction neurons 440($a$-$n$) may be a layer of neurons that applies a second weighed matrix to the compressed data via the extraction neurons 440($a$-$n$). The second weighted matrix includes numerous different weights 470($a$-$b$) in which each extraction neuron 440($a$-$n$) is associated with a corresponding weight 470($a$-$b$). Each weight 470($a$-$n$) when applied as a second weighted matrix to the compressed data via the extraction neurons 440($a$-$n$) generates a corresponding value for the compressed data relative to each corresponding weight 470($a$-$b$) applied via the second weighted matrix represented by the extraction neurons 440($a$-$n$). For example, FIG. 4 depicts that a second weighted matrix that includes the weights 470($a$-$b$) is applied via 90 different extraction neurons 440($a$-$n$) to each of the 10 compressed neurons 430($a$-$n$) that the compressed data is applied.

In an embodiment, each of the values of the weights 470($a$-$b$) included in the second weighed matrix may be identical the weights 460($a$-$b$) included in the first weighted matrix as determined by pre-emptively training the autoencoder neural network configuration 400. In applying the identical values of the weights 470($a$-$b$) included in the second weighted matrix to the compressed neurons 430($a$-$n$) as the weights 460($a$-$b$) included in the first weighted matrix to the input neurons 410($a$-$n$), the autoencoder neural network configuration 400 may determine whether the input data originally applied to the input neurons 410($a$-$n$) has been previously identified by the autoencoder neural network configuration 400.

The autoencoder neural network configuration 400 may then decompress the result of the second weighted matrix that is applied to the to the compressed neurons 430($a$-$n$) via the extraction neurons 440($a$-$n$) to the layer of compressed neurons 430($a$-$n$), where n is an integer equal to or greater than one. For example, FIG. 4 depicts that the application of the second weighted matrix via the 90 extraction neurons 440($a$-$n$) is applied to the compressed data via the 10 compressed neurons 430($a$-$n$) is then decompressed from the 10 compressed neurons 430($a$-$n$) to 41 decompressed neurons 450($a$-$n$) such that the 41 decompressed neurons 430($a$-$n$) are a decompressed representation of the second weighted matrix applied to the compressed data of the 10 compressed neurons 430($a$-$n$).

The application of the second weighted matrix to the compressed neurons 430($a$-$n$) that includes identical values of the weights 470($a$-$n$) as the weights 460($a$-$n$) included in the first weighted matrix that is applied to the input neurons 410($a$-$n$) enables the autoencoder neural network configuration 400 to determine whether the output data as output by the decompressed neurons 450($a$-$n$) replicates the input data input into the input neurons 410($a$-$n$) within a threshold. As noted above, the weights 460($a$-$n$) included in the first weighted matrix and applied to the input neurons 410($a$-$n$) were pre-emptively determined to identify events and/or conditions that have been previously identified. In order to pre-emptively train the analog neuromorphic neuron circuit 400 to determine the weights 460($a$-$n$) included in the first weighted matrix to properly identify the input data associated with the event and/or condition, such input data has been previously input into the autoencoder neural network configuration 400 and/or a similar autoencoder neural network configuration to determine the weights 460($a$-$n$).

The compression of the input data via the input neurons 410($a$-$n$) by the application of the weights 460($a$-$n$) included in the first weighted matrix and then the subsequent decompression of the compressed neurons 430($a$-$n$) with the application of the weights 470($a$-$n$) included in the second weighted matrix should then result in output data that replicates the input data within a threshold when the input data has been previously identified by the autoencoder neural network configuration 400. As noted above, the autoencoder neural network configuration 400 identifies the input data when the input data was previously input into the autoencoder neural network configuration 400 and/or a similar autoencoder neural network configuration thereby resulting in output data that replicates the input data within a threshold after the compression and then decompression of the input data to generate the output data via the weights 460($a$-$n$) and the weights 470($a$-$n$).

As a result, the autoencoder neural network configuration 400 may determine whether the output data that is output from the decompressed neurons 450($a$-$n$) is within a threshold of the input data that is initially input into the input neurons 410($a$-$n$) to determine whether the input data has been previously identified by the autoencoder neural network configuration 400. The autoencoder neural network configuration 400 may determine that the input data has been previously identified by the autoencoder neural network configuration 400 when the output data is within a threshold of the input data thereby indicating that the event and/or condition associated with the input data has been previously identified by the autoencoder neural network configuration 400. The autoencoder neural network configuration 400 may determine that the input data has not been previously identified by the autoencder neural network configuration 400 when the output data fails to be within a threshold of the input data thereby indicating that the event and/or condition associated with the input data has not been previously identified by the autoencoder neural network configuration 400. The autoencoder neural network configuration 400 may then generate an alert notifying the user when the output data fails to be within the threshold of the input data as the event and/or condition associated with the input data has not been previously identified by the autoencoder neural network configuration 100.

The comparison of the input data to the output data satisfies the threshold when the comparison indicates that the input data associated with the event and/or condition has been previously identified by the autoencoder neural network configuration 100. The comparison of the input data to the output data fails to satisfy the threshold when the comparison fails to indicate that the input data associated with the event and/or condition has been previously identified by the autoencoder neural network configuration 100.

In an embodiment, the threshold may be satisfied when the difference between the input data and the output data is within the threshold such that the difference indicates that the input data associated with the event and/or condition has been previously identified by the autoencoder neural network configuration 100. In such an example and the threshold may fail to be satisfied when the difference between the input data and the output data is outside the threshold such that the difference indicates that the input data associated with the event and/or condition has not been previously identified by the autoencoder neural network configuration 400. For example, the autoencoder neural network configuration 400 when applied to a cybersecurity network may generate an alert when an event and/or condition generates a difference between the input data and the output data that exceeds the threshold when applied to the autoencoder neural network configuration 400 thereby indicating that the event and/or condition has not been previously identified by the autoencoder neural network configuration 400 and may be a zero day attack on associated network.

The encoder (∅) and decoder (ϕ) processes are shown in equations (1) and (2):

$$\emptyset: X \to \mathcal{F} \quad (1)$$

$$\phi: \mathcal{F} \to X \quad (2)$$

The output of the autoencoder neural network configuration described in FIG. 4 may be obtained by carrying out equations (3-6) where b denotes a bias value, and f(x) denotes neuron activation function:

$$L_{1j} = f(\Sigma_{i=1}^{41} w_{1(i,j)} \cdot x_i + b_{1j}) \quad (3)$$

$$L_{2k} = f(\Sigma_{j=1}^{90} w_{2(j,k)} \cdot h_{1j} + h_{2k}) \quad (4)$$

$$L_{3j} = f(\Sigma_{k=1}^{10} w'_{2(k,j)} \cdot h_{2k} + b_{3j}) \quad (5)$$

$$L_{4i} = f(\Sigma_{j=1}^{90} w'_{1(j,i)} \cdot h_{3j} + b_{4i}) \quad (6).$$

Figure 5:
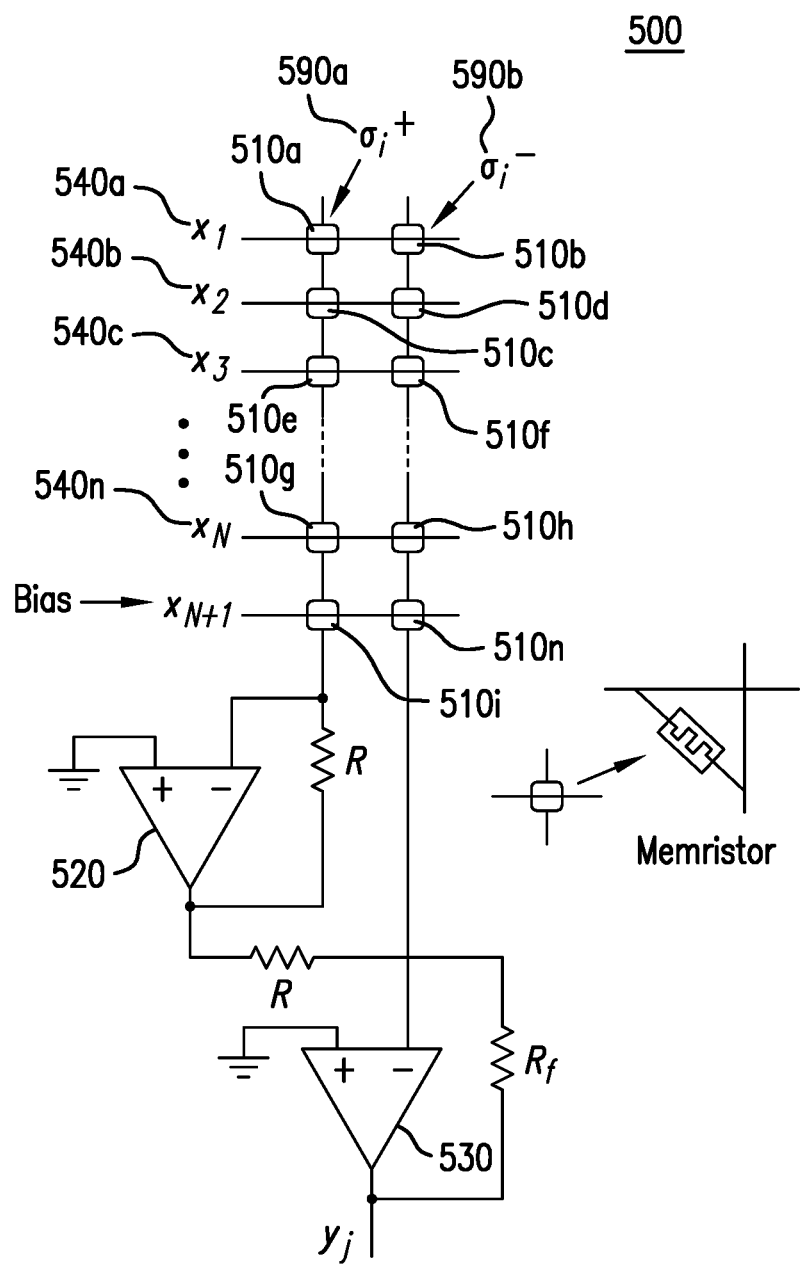
FIG. 5 is a schematic illustration of a single resistive memory based neuron that may be implemented as a neuron layer in the autoencoder neural network configuration of FIG. 4 to convert the output voltage of the column generated from the execution of dot-product operations to a dot-product operation value in accordance with an embodiment of the disclosure.

Referring to FIG. 5, in which like reference numerals are used to refer to like parts, a single resistive memory based neuron 500 that may be implemented as a neuron layer in the autoencoder neural network configuration 400 that may be implemented to convert the output voltage of the column generated from the execution of dot-product operations to a dot-product operation value is shown. The single resistive memory based neuron 500 includes a plurality of resistive memories 510(a-n), a plurality of input voltages 540(a-n), a conductance 590a, a conductance 590b, a first op-amp configuration 520 and a second op-amp configuration 530. The single resistive memory based neuron 500 shares many similar features with the analog neuromorphic processing device 100, the analog neuromorphic circuit 200, the neural network configuration 300, and the autoencoder neural network configuration 400 therefore, only the differences between the single resistive memory based neuron 500, and the autoencoder neural network configuration 400, the analog neuromorphic processing device 100, the analog neuromorphic circuit 200, and the neural network configuration 300 are to be discussed in further detail.

The single resistive memory based neuron 500 may be incorporated into the autoencoder neural network configuration 400 as a neuron layer to execute the unsupervised learning of events and/or conditions that have not been previously identified by the autoencoder neural network configuration 400. The single resistive memory based neuron 500 is patterned in a crossbar structure, which is capable of performing many multiply-add operations in parallel fashion in the analog domain. Each column of the analog neuromorphic circuit 700 in FIG. 7 generates an output voltage signal which is also generated in the single resistive memory based neuron 500. The output voltage signal is generated from each input voltage 540(a-n) being applied to each corresponding horizontal wire and then generating a current from each of the resistive values for each resistive memory 410(a-n) that is then propagated through the analog neuromorphic circuit 700 and as discussed in detail in U.S. Nonprovisional application Ser. No. 17/362,272 which is incorporated by reference in its entirety. The output voltage signal that is generated as an output of each column in the analog neuromorphic circuit 700 represents the dot-product operation values generated from the dot product operation of the vector and the matrix by the analog neuromorphic circuit 700. However, the output voltage signal is a voltage and is yet to be converted to a non-binary value, such as a positive or negative floating point number, that is substantially equivalent to the dot-product operation value.

Resistive memories 510(a-n) may be utilized in unsupervised learning neural networks to approximate the concept of synaptic connectivity. In doing so, the resistive memories may be used to store the connection strength between a neuron incoming connections to the neuron. FIG. 5 depicts that each pair of resistive memories 510(a-n) represent a single weight. The left column of resistive memories 510(a-n) may represent a positive excitatory connection and the right column of resistive memories 510(a-n) may represent an inhibitory connection. In each row of the single resistive memory based neuron 500, a net positive synaptic weight may be present when the conductance 590a is greater than the conductance 590b and a negative synaptic weight may be present when the conductance 590a is less than the conductance 590b.

The single resistive memory based neuron 500 may be implemented so that dot-product operations may be executed in a similar manner as a conventional computing system would execute dot-product operations but utilizing significantly less power than a conventional computing system and requiring significantly less space than a conventional computing system. For example, conventional computing systems execute dot-product operations in applications such as neural applications, image recognition, image processing, digital signal processing, video games, graphics and so on. In executing the dot-product operations, the conventional computing systems execute a vector/matrix multiplication operation where the conventional computing system takes values in a vector format and executes a multiplication operation with values in a matrix format.

However, conventional computing systems are able to execute dot-product operations when the values included in the vector format as well as the values included in the matrix format are non-binary numbers, such as floating point numbers, such that the outputs of the executed dot-product operations are also non-binary numbers. Conventional computing systems are not limited to simple values such as positive integer values. Rather, conventional computing systems are able to execute dot-product operations with any floating point number whether those floating point numbers be positive or negative. For example, a simple electronic calculator is capable of multiplying a negative floating point number of "−2.35965" with a positive floating point number of "7.525" to generate a negative floating point number of "−17.5636625".

The single resistive memory based neuron 500 and the analog neuromorphic circuit 700 in a greater magnitude may execute dot product operations with regards to non-binary numbers in a similar manner as conventional computing devices without consuming significant amounts of power and/or incorporating significant amounts of space as conventional computing devices. In doing so, each value included in the vector that is requested to take part in the dot-product operation with the matrix is converted to a voltage and is applied as an input voltage 540(a-n) to each horizontal wire as discussed in detail in U.S. Nonprovisional application Ser. No. 17/364,019 which is incorporated by reference in its entirety.

The value of the (DP$_j$) may be calculated according to equation (7) as the voltage difference between the left and right column wires. Thus, each single resistive memory based neuron 500 included in the autoencoder neural network configuration 400 may perform a set of dot product calculations between the input voltages 540(a-n) of each corresponding single resistive memory based neuron 500 and the net conductance of each resistive memory pair, $$DP_j = \Sigma_{i=1}^{N+1} x_i \times (\sigma_{ij}^+ - \sigma_{ij}^-) \quad (7).$$

The output, y$_j$ in FIG. 5 represents the neuron output of the single resistive memory based neuron 500. The power rails of the first op-amp configuration 520 and the second op-amp configuration 530 in V$_{DD}$ and V$_{SS}$ are set to 0V and 1V, respectively. The sigmoid in equation (8) may be incorporated as an activation function in deep learning systems, $$f(x) = \frac{1}{1+e^{-x}}. \quad (8)$$

However, single resistive memory based neuron 500 may incorporate the approximated sigmoid function in equation (9) and may be generated by an op-amp circuit as provided in the single resistive memory based neuron 500, $$g(x) = \begin{cases} 1, & x > 2 \\ 0.25x + 0.5, & |x| \le 2 \\ 0, & x < 2 \end{cases} \quad (9)$$

Figure 6:
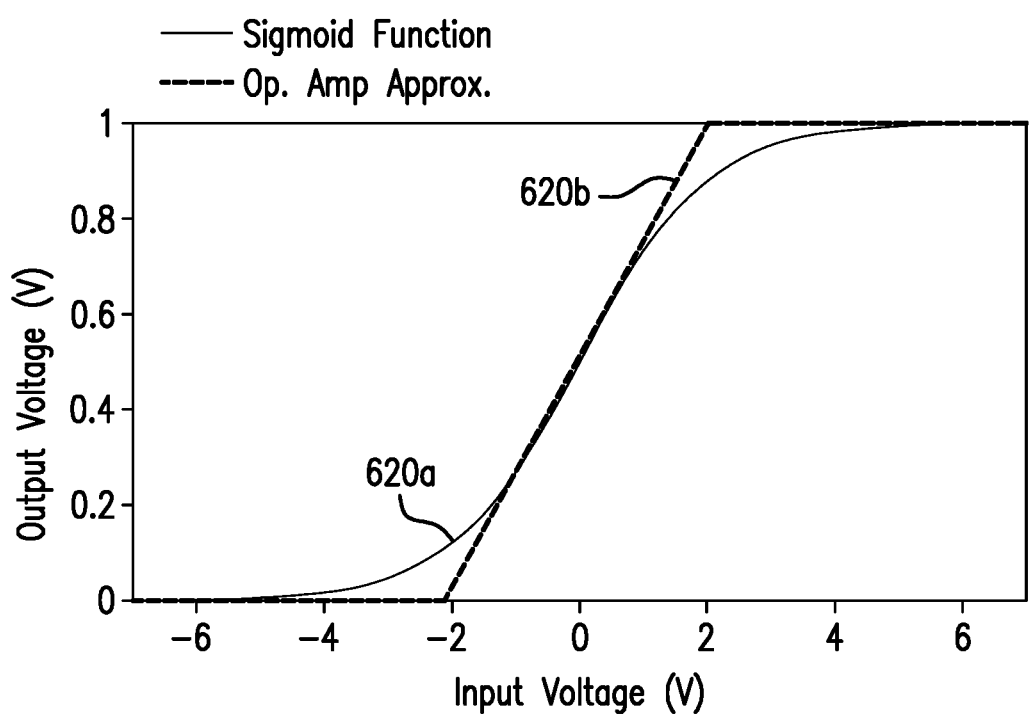
FIG. 6 is a schematic illustration of an op-amp configuration that may generate a pseudo sigmoid function in accordance with an embodiment of the disclosure.

The single resistive memory based neuron 500 includes the first op-amp configuration 520 and the second op-amp configuration 530 that may be positioned at the output of each column of the analog neuromorphic circuit 700 to both scale the output voltage signal to a value on the non-linear smooth function 610 between "0" and "1" and does so by incorporating a neuron function such as an activation function and/or a thresholding function. The first op-amp configuration 520 may generate a pseudo sigmoid function, such as pseudo sigmoid functions 620(a-b) as shown in FIG. 6. The first op-amp configuration 520 may be configured such that the op-amp linear configuration 520 incorporates a linear amplifier transfer function bounded by upper and lower voltage rails that are similar to the desired bounds of the non-linear smooth function 600. For example, the first op-amp configuration 520 may incorporate a linear amplifier transfer function that is bounded by an upper voltage of 1.0V and a lower voltage of 0.0V.

Figure 7:
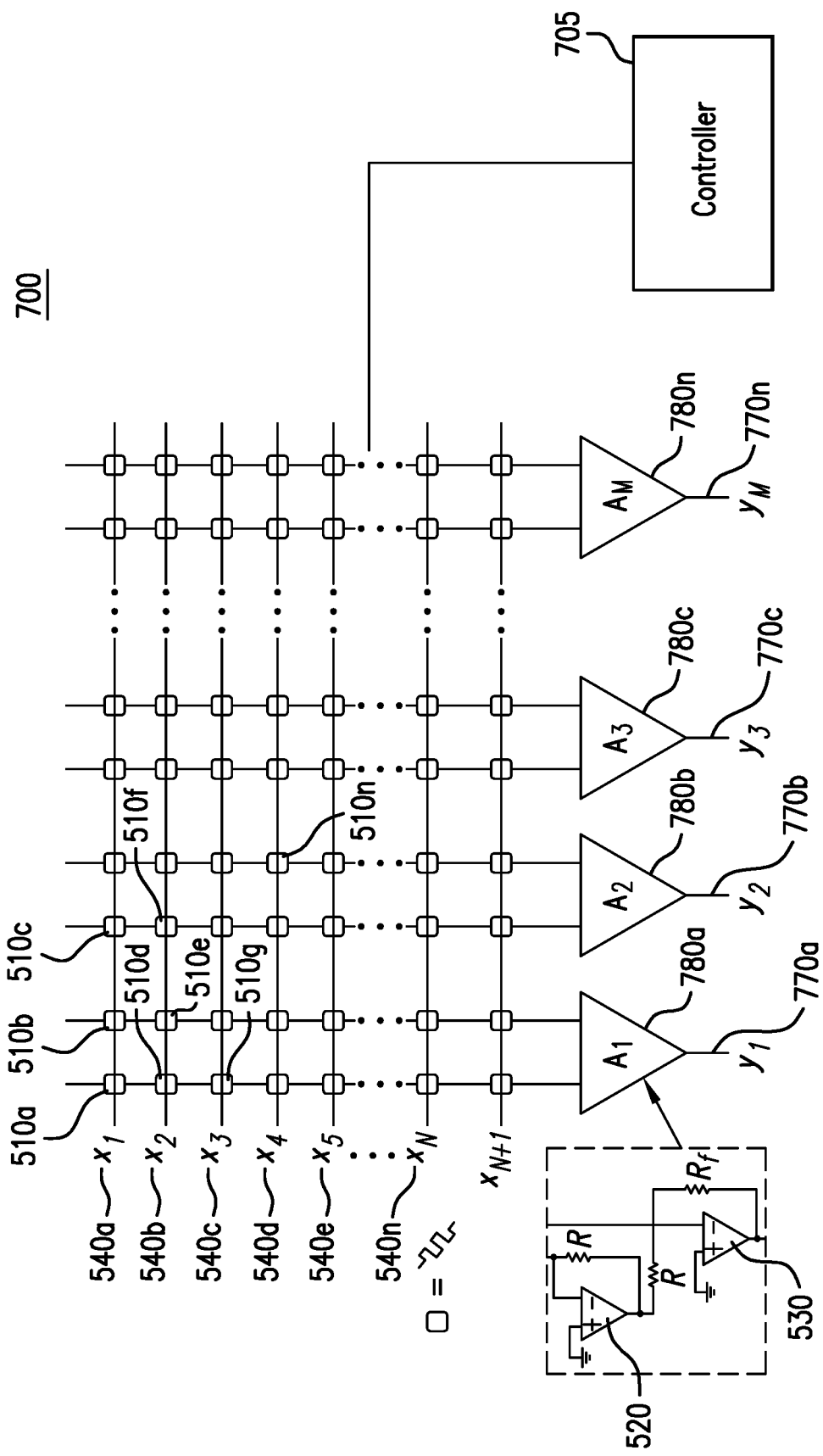
FIG. 7 is a schematic illustration of the analog neuromorphic circuit to execute dot-product operations and may be incorporated into the autoencoder neural network configuration of FIG. 4.

Referring to FIG. 7, in which like reference numerals are used to refer to like parts, the analog neuromorphic circuit 700 is shown that may be implemented to execute dot-product operations in a similar manner as a conventional computing device and may be incorporated into the autoencoder neural network configuration 400. The analog neuromorphic circuit 700 includes the plurality of resistive memories 510(a-n), the plurality of input voltages 540(a-n), a plurality of amplifiers 780(a-n), and a plurality of dot-product operation values 770(a-n). The analog neuromorphic circuit 700 shares many similar features with the analog neuromorphic processing device 100, the analog neuromorphic circuit 200, and the neural network configuration 300, the autoencoder neural network configuration 400, and the single resistive memory based neuron 500; therefore, only the differences between the analog neuromorphic circuit 700 and the analog neuromorphic processing device 100, the analog neuromorphic circuit 200, the neural network configuration 300, the autoencoder neural network configuration 400, and the single resistive memory based neuron 500 are to be discussed in further detail.

An analog neuromorphic circuit 700 implements a plurality of resistive memories 510(a-n) and in doing so operates as the autoencoder neural network configuration 400 discussed in detail above. The analog neuromorphic circuit 700 may be implemented in a first memristor crossbar configuration 480 that includes a first plurality of resistive memories 510(a-n) that is configured to provide a first plurality of resistance values to each corresponding input voltage 540(a-n) applied to the first memristor crossbar configuration 480 to generate a first plurality of output voltages 770(a-n). The first plurality of output voltages is compressed from the plurality of input voltages 540(a-n).

As discussed in detail above regarding the autoencoder neural network configuration 400, the data set associated with the event and/or condition may be applied to the analog neuromorphic circuit 700 which is implemented as the first memristor crossbar configuration 480 as the input voltages 540(a-n). For example as shown in FIG. 4 regarding the autoencoder neural network configuration 400, the analog neuromorphic circuit 700 may be implemented as the first memristor crossbar configuration 480 as the input neurons 410(a-n) in the autoencoder neural network configuration 400. In such an example, 41 different input voltages 540(a-n) are applied to the analog neuromorphic circuit 700 representing the data set of the event and/or condition that is requested to be identified.

The first plurality of resistive memories 510(a-n) positioned in the first memristor crossbar configuration 480 may have been previously trained to identify data sets associated with events and/or conditions that have been previously identified by the autoencoder neural network configuration 400 and have resistance values that correspond to weights associated with each of the resistive memories 510(a-n) positioned in the first memristor crossbar configuration 480. The first plurality of resistive memories 510(a-n) correspond to the extraction neurons 420(a-n) discussed in detail above regarding the autoencoder neural network configuration 400. The resistance values associated the first plurality of resistive memories correspond to weights similar to the weights 460(a-b) discussed in detail above regarding the autoencoder neural network configuration 400. The first plurality of resistive memories 510(a-n) may apply the corresponding resistance values as weights 460(a-n) to each of the input voltages 540(a-n) that are applied to the analog neuromorphic circuit 700 as the first memristor crossbar configuration 480. In doing so, each of the resistance values correspond to weights and when applied to the input voltages 540(a-n) correspond to a first weighted matrix that is applied to the input voltages 540(a-n) as discussed in detail above regarding the autoencoder neural network configuration 400.

The resistance values that correspond to the first plurality of resistive memories 510(a-n) when applied as the first weighted matrix to the input voltages 540(a-n) may extract data values associated with the resistance values that correspond to the first plurality of resistive memories 510(a-n) and are applied to the input voltages 540(a-n). In doing so, the first plurality of resistive memories 510(a-n) may operate as a layer of extraction neurons 420(a-n) as discussed above and extract the input neurons 410(a-n) into the layer of extraction neurons 420(a-n). For example as shown in FIG. 4 regarding the autoencoder neural network configuration 400, the first plurality of resistive memories 510(a-n) may be applied to the 41 input voltages 540(a-n) thereby resulting in 90 output voltages.

The input voltages 540(a-n) may then be compressed to the first plurality of output voltages 770(a-n) that correspond to the layer of compressed neurons 430(a-n) as discussed in detail above regarding the autoencoder neural network configuration 400. In doing so, the first plurality of output voltages 770(a-n) are compressed voltages from the resistance values corresponding to the first plurality of resistive memories 510(a-n) applied as the first weighted matrix to the input voltages 540(a-n). For example as shown in FIG. 4 regarding the autoencoder neural network configuration 400, the 90 output voltages generated from the application of the resistance values associated with the first plurality of resistive memories as the first weighted matrix to the input voltages 540(a-n) may then be input into to the analog neuromorphic circuit 700 to then compress the input voltages 540(a-n) to the first plurality of output voltages 770 (a-n). In such an example, the 90 output voltages are compressed to 10 output voltages of the first plurality of output voltages 770(a-n) that correspond to the 10 compressed neurons 430(a-n) included in the autoencoder neural network configuration 400. In doing so, the data set associated with the event and/or condition as represented by the 41 input voltages 540(a-n) is compressed to the 10 output voltages from the first plurality of output voltages 770(a-n).

The analog neuromorphic circuit 700 may also be implemented into a second memristor crossbar configuration 490 that includes a second plurality of resistive memories 510 (a-n) that is configured to provide a second plurality of resistance values to each corresponding output voltage 770 (a-n) from the first plurality of output voltages 770(a-n) generated from the first memristor crossbar configuration 480 and applied to the second memristor crossbar configuration 490 to generate a second plurality of output voltages 770(a-n). The second plurality of output voltages 770(a-n) is decompressed from the first plurality of output voltages 770(a-n).

As discussed in detail above regarding the autoencoder neural network configuration 400, the first plurality of output voltages 770(a-n) may be applied to the analog neuromorphic circuit 700 which is implemented as the second memristor crossbar configuration 490 as the input voltages 540(a-n). For example as shown in FIG. 4 regarding the autoencoder neural network configuration 400, the analog neuromorphic circuit 700 may be implemented as the as the second memristor crossbar configuration 490 as the compressed neurons 430(a-n) in the autoencoder neural network configuration 400. In such an example, 10 different input voltages 540(a-n) are applied to the analog neuromorphic circuit 700 representing the compressed output voltages from the first plurality of output voltages 770(a-n).

The second plurality of resistive memories 510(a-n) positioned in the second memristor crossbar configuration 490 may include resistance values that are identical to the first plurality of resistive memories 510(a-n) positioned in the first memristor crossbar configuration 480. The second plurality of resistive memories 510(a-n) correspond to the extraction neurons 440(a-n) discussed in detail above regarding the autoencoder neural network configuration 400. The resistance values associated with the second plurality of resistive memories correspond to weights similar to the weights 470(a-b) discussed in detail above regarding the autoencoder neural network configuration 400. The second plurality of resistive memories 510(a-n) may apply the corresponding resistance values as weights 470(a-n) to each of the input voltages 540(a-n) that represent the first plurality of output voltages that are applied to the analog neuromorphic circuit 700 as the second memristor crossbar configuration 490. In doing so, each of the resistance values correspond to weights and when applied to the input voltages 540(a-n) that represent the first plurality of output voltages correspond to a second weighted matrix that is applied to the input voltages 540(a-n) that represent the first plurality of output voltages as discussed in detail above regarding the autoencoder neural network configuration 400.

The resistance values that correspond to the second plurality of resistive memories 510(a-n) when applied as the second weighted matrix to the input voltages 540(a-n) that represent the first plurality of output voltages may extract data values associated with the resistance values that correspond to the second plurality of resistive memories 510(a-n) and are applied to the input voltages 540(a-n) that represent the first plurality of output voltages. In doing so, the second plurality of resistive memories 510(a-n) may operate as a layer of extraction neurons 440(a-n) as discussed above and extract the compressed neurons 430(a-n) into the layer of extraction neurons 440(a-n). For example as shown in FIG. 4 regarding the autoencoder neural network configuration 400, the second plurality of resistive memories 510(a-n) may be applied to the 10 input voltages 540(a-n) that represent the 10 output voltages from the first plurality of output voltages thereby resulting in 90 output voltages.

The input voltages 540(a-n) that represent the first plurality of output voltages may then be decompressed to the second plurality of output voltages 770(a-n) that correspond to the layer of decompressed neurons 450(a-n) as discussed in detail above regarding the autoencoder neural network configuration 400. In doing so, the second plurality of output voltages 770(a-n) are decompressed voltages from the resistance values corresponding to the second plurality of resistive memories 510(a-n) applied as the second weighted matrix to the input voltages 540(a-n) that represent the first plurality of output voltages. For example as shown in FIG. 4 regarding the autoencoder neural network configuration 400, the 90 output voltages generated from the application of the resistance values associated with the second plurality of resistive memories 510(a-n) as the second weighted matrix to the input voltages 540(a-n) that represent the first plurality of output voltages may then be input into to the analog neuromorphic circuit 700 to then decompress the input voltages 540(a-n) that represent the first plurality of output voltages to the second plurality of output voltages 770(a-n). In such an example, the 90 output voltages are decompressed to 41 output voltages of the second plurality of output voltages 770(a-n) that correspond to the 41 decompressed neurons 450(a-n) included in the autoencoder neural network configuration 400. In doing so, the data set associated with the event and/or condition as represented by the 41 input voltages 540(a-n) is compressed to the 10 output voltages from the first plurality of output voltages 770(a-n) and then decompressed back to the 41 output voltages from the second plurality of output voltages 770(a-n).

The controller 705 may compare the second plurality of output voltages 770(a-n) that are output from the second memristor crossbar configuration 490 to the plurality of input voltages 540(a-n) that were initially applied to the first memristor crossbar configuration 480 to determine if the second plurality of output voltages 770(a-n) is within a threshold of the plurality of input voltages 540(*a-n*). The controller 705 may generate an alert when the second plurality of output voltages 770(*a-n*) that are output from the second memristor crossbar configuration 490 exceeds the threshold from the plurality of input voltages 540(*a-n*) initially applied to the first memristor crossbar configuration 480 thereby indicating that input data associated with the plurality of input voltages 540(*a-n*) has not been previously input into the analog neuromorphic circuit 700.

As discussed in detail above regarding the autoencoder neural network configuration 400, the controller 705 may determine whether the data set associated with the event and/or condition that when applied to the first memristor crossbar configuration 480 as input voltages 540(*a-n*) has been previously identified by the analog neuromorphic circuit 700 acting as the autoencoder neural network configuration 400. The controller 705 may determine that the event and/or condition has been previously identified by the analog neuromorphic circuit 700 when the input voltages 540(*a-n*) representing the data set associated with the event and/or condition is within a threshold of the second plurality of output voltages 770(*a-n*) after being compressed and then decompressed thereby indicating that the data set associated with the event and/or condition was previously input into the analog neuromorphic circuit 700. As a result, the event and/or condition has been previously identified by the controller 705 and is known to the controller 705.

The controller 705 may determine that the event and/or condition has not been previously identified by the analog neuromorphic circuit when the input voltages 540(*a-n*) are outside a threshold of the second plurality of output voltages 770(*a-n*) after being compressed and then decompressed thereby indicating that the data set associated with the event and/or condition was not previously input into the analog neuromorphic circuit 700. As a result, the event and/or condition has not been previously identified by the controller 705 and is unknown to the controller 705. The controller 705 may then generate an alert indicating that the event and/or condition has not been previously identified and is unknown.

Each resistance from the first plurality of resistance values may be mapped to a corresponding weighted value that is a non-binary value included in a first weighted matrix. Each resistance value from the second plurality of resistance values is mapped to a corresponding weighted value that is a non-binary value included in a second weighted matrix.

The controller 705 may compare the second plurality of output voltages 770(*a-n*) output from the second memristor crossbar configuration 490 to the plurality of input voltages 540(*a-n*) input into the first memristor crossbar configuration 480 in compressing the plurality of input voltages 540(*a-n*) and the second weighted matrix is applied to the second memristor crossbar configuration 490 in decompressing the second plurality of output voltages 770(*a-n*) from the first plurality of output voltages output from the first memristor crossbar configuration 480. The first weighted matrix may be identical to the second weighted matrix. The controller 705 may generate an alert when the second plurality of output voltages 770(*a-n*) exceeds the threshold form the plurality of input voltages 540(*a-n*) after the first weighted matrix is applied to the first memristor crossbar configuration 480 and the second weighted matrix is applied to the second memristor crossbar configuration 490 thereby indicating that the application of the first weighted matrix and the second weighted matrix that are identical failed to generate the second plurality of output voltages 770(*a-n*) that are within the threshold of the plurality of input voltages 540(*a-n*).

Each first output voltage value associated with the first plurality of output voltages 770(*a-n*) output from the first memristor crossbar configuration 480 is generated from a dot product operation conducted by the first memristor crossbar configuration 480. Each second output voltage value associated with the second plurality of output voltages 770(*a-n*) output from the second memristor crossbar configuration 490 is generated from a dot product operation conducted by the second memristor crossbar configuration 490.

The first memristor crossbar configuration 480 that includes the first plurality of resistive memories 510(*a-n*) is further configured to provide the first plurality of resistance values to each corresponding output voltage form the first plurality of output voltages 770(*a-n*) that is compressed from the plurality of input voltages 540(*a-n*) that is applied to the first memristor crossbar configuration 480 to generate the second plurality of output voltages 770(*a-n*) that is decompressed from the first plurality of output voltages 770(*a-n*). The compression of the plurality of input voltages 540(*a-n*) and the decompression of the first plurality of output voltages 770(*a-n*) to generate the second plurality of output voltages 770(*a-n*) is conducted by a single memristor crossbar configuration. Rather than have the output voltages from the first plurality of output voltages 770(*a-n*) that are compressed as outputs from the first memristor crossbar configuration 480 input into a different analog neuromorphic circuit 700 that is implemented as the second memristor crossbar configuration 490 for the decompression, the output voltages from the first plurality of output voltages 770(*a-n*) may be input into the same analog neuromorphic circuit 700 for the decompression that also executed the compression.

The first memristor crossbar configuration 480 may be implemented to execute the compression of the input voltages 540(*a-n*) as discussed in detail above and the second memristor crossbar configuration 490 may be implemented to execute the decompression to generate the second plurality of output voltages 770(*a-n*) as discussed in detail above. The first memristor crossbar configuration 480 may include any quantity of layers of the analog neuromorphic circuit 700 discussed above in order execute the compression operation discussed in detail above that will be apparent to those skilled in the relevant art(s) without departing from the spirit and scope of the disclosure. The second memristor crossbar configuration 490 may include any quantity of layers of the analog neuromorphic circuit 700 discussed above in detail above in order execute the decompression operation that will be apparent to those skilled in the relevant art(s) without departing from the spirit and scope of the disclosure.

In an embodiment, the first memristor crossbar configuration 480 may include the identical quantity and architecture of the analog neuromorphic circuit 700 as the second memristor crossbar configuration 490. In an embodiment, the first crossbar configuration may include a different quantity and architecture of the analog neuromorphic circuit 700 as the second memristor crossbar configuration 490. In an embodiment, the first memristor crossbar configuration 480 in executing the compression operations may also be implemented as the second memristor crossbar configuration 490 in executing the decompression operations. In an embodiment, the first weighted matrix implemented by the first memristor crossbar configuration 480 in executing the compression operation may be identical to the second weighted matrix implemented by the second memristor crossbar configuration 490 in executing the decompression operation. In an embodiment, the first weighted matrix implemented by the first memristor crossbar configuration 480 in executing the compression operation may differ from the second weighted matrix implemented by the second memristor crossbar configuration 490 in executing the decompression operation.

Figure 8:
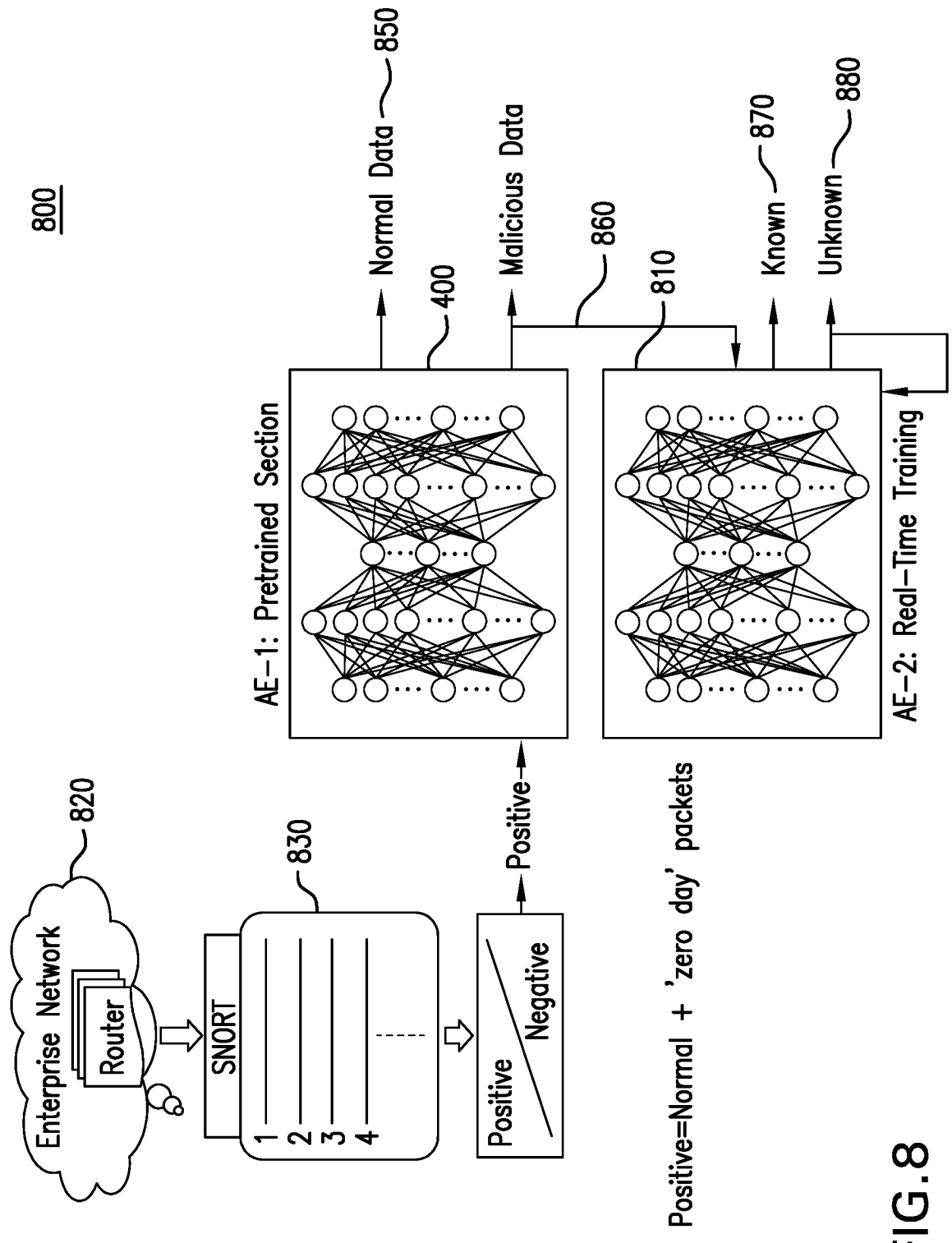
FIG. 8 is a schematic illustration of a real-time autoencoder configuration to provide unsupervised learning with regard to events and/or conditions that are not previously identified by the autoencoder neural network configuration in FIG. 4.

Referring to FIG. 8, in which like reference numerals are used to refer to like parts, the autoencoder configuration 800 is shown that may be implemented to provide unsupervised learning with regard to events and/or conditions that are not previously identified by the autoencoder 400 discussed in great detail above. The autoencoder configuration 800 includes the autencoder 400 as discussed in great detail above, a real-time training autoencoder 810, a network 820, and a SNORT configuration 830. The autoencoder configuration 800 shares many similar features with the analog neuromorphic processing device 100, the analog neuromorphic circuit 200, the neural network configuration 300, the autoencoder neural network configuration 400, the single resistive memory based neuron 500, and the analog neuromorphic circuit 700; therefore, only the differences between the autoencoder configuration 800 and the analog neuromorphic processing device 100, the analog neuromorphic circuit 200, the neural network configuration 300, the autoencoder neural network configuration 400, the single resistive memory based neuron 500, and the autoencoder configuration 800 are to be discussed in further detail.

A second analog neuromorphic circuit that includes a third plurality of resistive memories may be implemented as the real-time training autoencoder 810 in addition to the autoencoder neural network configuration 400 and may provide a third plurality of resistance values to each corresponding input voltage from the plurality of input voltages 540(*a-n*) initially input into the first memristor crossbar configuration 480 when the second plurality of output voltages 770(*a-n*) output from the second memristor crossbar configuration 490 exceeds the threshold from the plurality of input voltages 540(*a-n*) to train the second analog neuromorphic circuit to identify the input data associated with the plurality of input voltages 540(*a-n*). The first memristor crossbar configuration 480 and the second memristor crossbar configuration 490 are included in autoencoder neural network configuration 400 as discussed in detail above. The controller 705 may provide the plurality of input voltages 540(*a-n*) to the second analog neuromorphic circuit that is implemented as the real-time training autoencoder 810 when the second plurality of output voltages 770(*a-n*) output from the second memristor crossbar configuration 490 exceeds the threshold from the plurality of input voltages 540(*a-n*) thereby indicating that the plurality of input voltages 540 (*a-n*) has not been previously identified and the training of the second analog neuromorphic circuit as the real-time training autoencoder 810 to identify the input data associated with the plurality of input voltages 540(*a-n*) is required.

As discussed in detail above, in an embodiment, the autoencoder neural network configuration 400 may be pre-trained in that that weights associated with each of the resistive memories included in the autoencoder neural network configuration 400 may be pre-selected based on events and/or conditions previously identified by the autoencoder neural network configuration 400. However, when the controller 705 determines that the output voltages output of the autoencoder neural network configuration 400 exceed the threshold of the input voltages input into the autoencoder neural network configuration 400, the controller 705 may feedback the output voltages output and input as input voltages into the real-time training autencoder 810. In doing so, the real-time training autoencoder 810 may then conduct unsupervised training of the resistive memories included in the real-time training autoencoder 810 to learn the previously unidentified event and/or condition.

The real-time training encoder 810 may continue to conduct unsupervised training on previously unidentified events and/or conditions that have been input into the autoencoder neural network configuration 400 such that the real-time training encoder 810 may be trained such that the previously unidentified events and/or conditions become identified events and/or conditions. The resistance values of each of the corresponding resistive memories included in the real-time training encoder 810 may be updated in real-time rather than pre-emptively as discussed in detail above regarding the autoencoder neural network configuration 400. The real-time updating of the resistance values of each of the corresponding resistive memories may result in corresponding weights that when applied to output voltages output from the autoencoder neural network configuration 400 as being previously unidentified and input into the real-time training encoder 810 may result in the real-time training encoder 810 identifying the event and/or condition that was previously unidentified by the autoencoder neural network configuration 400.

For example, the network 820 may pass through events and/or conditions that engage the network 820 to the SNORT configuration 830. The SNORT configuration 830 is conventional software that examines events and/or conditions to identify potential cyberattacks on the network associated with the SNORT configuration 830. However, the SNORT configuration 830 is limited to identifying potential cyberattacks that have been pre-programmed into the conventional SNORT software. Any event and/or condition not identified by the SNORT configuration 830 may then pass through to the autoencoder neural network configuration 400. The data set associated with the event and/or condition may be applied to the autoencoder neural network configuration 400 as input voltages. The autoencoder neural network configuration 400 may then compress and decompress the input voltages to generate output voltages as discussed in detail above.

The controller 705 may then determine whether the output voltages output from the autoencoder neural network configuration 400 are within a threshold of the input voltages input into the autoencoder neural network configuration 705. The controller 705 may output a normal data signal 850 when the controller 705 determines that the output voltages output from the autoencoder neural network configuration 400 are within the threshold of the input voltages input into the autoencoder neural network configuration 400 thereby indicating that the event and/or condition has been previously identified by the autoencoder neural network configuration 400. The controller 705 may output a malicious data signal 860 when the controller 705 determines that the output voltages output from the autoencoder neural network configuration 400 are outside the threshold of the input voltages input into the autoencoder neural network configuration 400 thereby indicating that the event and/or condition has not been previously identified by the autoencoder neural network configuration 400 and may be a zero day cyberattack.

The controller 705 may feedback the malicious data signal 860 into the input of the real-time training encoder 810 in which the output voltages output from the autoencoder neural network configuration 400 are input as input voltages into the real-time training encoder 810. The real-time training encoder 810 may then compress and decompress the output voltages output from the autoencoder neural network configuration 400 as discussed in detail above as well as updating the resistance values of the resistive memories included in the real-time training encoder 810 to learn to identify the previously unidentified output voltages output from the autoencoder neural network configuration 400.

The controller 705 may then compare the output voltages output from the real-time training encoder 810 to the output voltages initially output from the autoencoder neural network configuration 400 and input into the real-time training encoder 810 to determine if the threshold is satisfied. The controller 705 may then generate the known signal 870 when the threshold is satisfied thereby indicating that the real-time training encoder 810 has been properly trained to now identify the previously unidentified event and/or condition. The controller 705 may generate the unknown signal 880 thereby indicating that the event and/or condition is still unidentifiable by the real-time training encoder 810. The controller 705 may then feedback the unknown signal 880 in which the output voltages output from the real-time training encoder are input into the real-time training encoder for additional iterations to train the resistance values of the resistive memories included in the real-time training encoder 810 to eventually identify the previously unidentified event and/or condition.

The plurality of input voltages 540(a-n) input into the first memristor crossbar configuration 480 may be converted to an input eigenvector, the first plurality of output voltages output from the first memristor crossbar configuration 480 may be converted to a first output eigenvector, and the second plurality of output voltages output from the second memristor crossbar configuration 490 may be converted to a second output eigenvector. The controller 705 may compare the second output eigenvector to the input eigenvector to determine if a difference between the second output eigenvector and the input eigenvector deviates beyond an error threshold. The deviation beyond the error threshold by the second output eigenvector and the input eigenvector is indicative that that the input data associated with the input voltages 540(a-n) has not been previously identified. The controller 705 may generate an alert when the difference between the second output eigenvector and the first input eigenvector exceeds the error threshold.

The controller 705 may square difference between each output value that corresponds to each second output voltage from the second plurality of output voltages output from the second memristor crossbar configuration 490 and each input voltage value that corresponds to each input voltage 540(a-n) input into the first memristor crossbar configuration 480 to generate a square rooted difference between each output voltage value and each corresponding input voltage value. The controller 705 may square root a sum of a square rooted difference between each output voltage value and each corresponding input voltage to generate a root squared error for the analog neuromorphic circuit 700. The controller 705 may compare the root squared error to a standard deviation as the error threshold. The standard deviation is previously determined as the error threshold that when the root squared error exceeds the standard deviation is indicative that the input data associated with the input voltages 540(a-n) has not been previously identified. The controller 705 may provide the plurality of input voltages 540(a-n) to the second analog neuromorphic circuit when the root squared error exceeds the standard deviation of the error threshold thereby indicating that the plurality of input voltages 540(a-n) has not been previously identified and the training of the second analog neuromorphic circuit to identify the input data associated with the plurality of input voltages is required.

Examples of controller 705 may include a mobile telephone, a smartphone, a workstation, a portable computing device, other computing devices such as a laptop, or a desktop computer, cluster of computers, set-top box, virtual reality headset, augmented reality headsets, smart glasses, mixed reality headsets, and/or any other suitable electronic device that will be apparent to those skilled in the relevant art(s) without departing from the spirit and scope of the disclosure.

In an embodiment, multiple modules may be implemented on the same computing device. Such a computing device may include software, firmware, hardware or a combination thereof. Software may include one or more applications on an operating system. Hardware can include, but is not limited to, a processor, a memory, and/or graphical user interface display.

The training algorithm for the second analog neuromorphic circuit that is added to the autoencoder neural network configuration 400 may be conceptually similar to that of a multilayer neural network, as the second analog neuromorphic circuit that is added to the autoencoder neural network configuration may be trained layer by layer. The second analog neuromorphic circuit that is added to the autoencoder neural network configuration 400 may have three hidden layers in addition to the input and output layers. The proposed training algorithm and training circuit has been adopted from equations (6)-(9):

1) Apply the input pattern $x_i$ to the input layer crossbar. Thus, the crossbar will compute the dot product $DP_j$ for each neuron and propagate the output signal $y_j$.
2) For each output layer crossbar, the error is computed as the difference between the input $x_1$ and the output $y_j$ as in equation (10).

$$\delta_j = (x_j - y_j) f'(DP_j) \qquad (10)$$

3) Backpropagate the error from each hidden layer neuron j as in equation (11).

$$\delta_j = \Sigma_k \delta_k w_{k,j} f'(DP_j) \qquad (11)$$

4) Update the weights according to the error function with a learning rate $\eta$.

The weight update rule is $\Delta w_j = \eta \delta_j x$.

5) Repeat this process until the error converges to a specified value.

In the proposed system on-chip learning may be implemented, meaning that the resistance values of the resistive memories may be tuned during the training process as the result of a learning algorithm. The resistance values of the resistive memories may be altered due to a set of incoming voltage pulses applied to specific devices for specific times. One of the advantages of on-chip training is that it accounts for the variation in resistance present across an array of resistive memories.

In this system, the training process does not use labels for learning the packet types. The training computation tracks the vector distance D between input and output samples as in equation (12) where $X_i$ and $Y_i$ are the input and output vectors respectively.

$$D = \sqrt{\Sigma (X_i - Y_i)^2} \qquad (12)$$

In the last epoch, the mean distance $D_m = DIN$ and standard deviation $D_{SD}$ (see equation (13)) are used to determine the threshold for packet detection. The value N denotes the total number of training samples.

$$D_{SD} = \sqrt{\frac{\sqrt{\Sigma(D - D_m)^2}}{N}} \quad (13)$$

Figure 9:
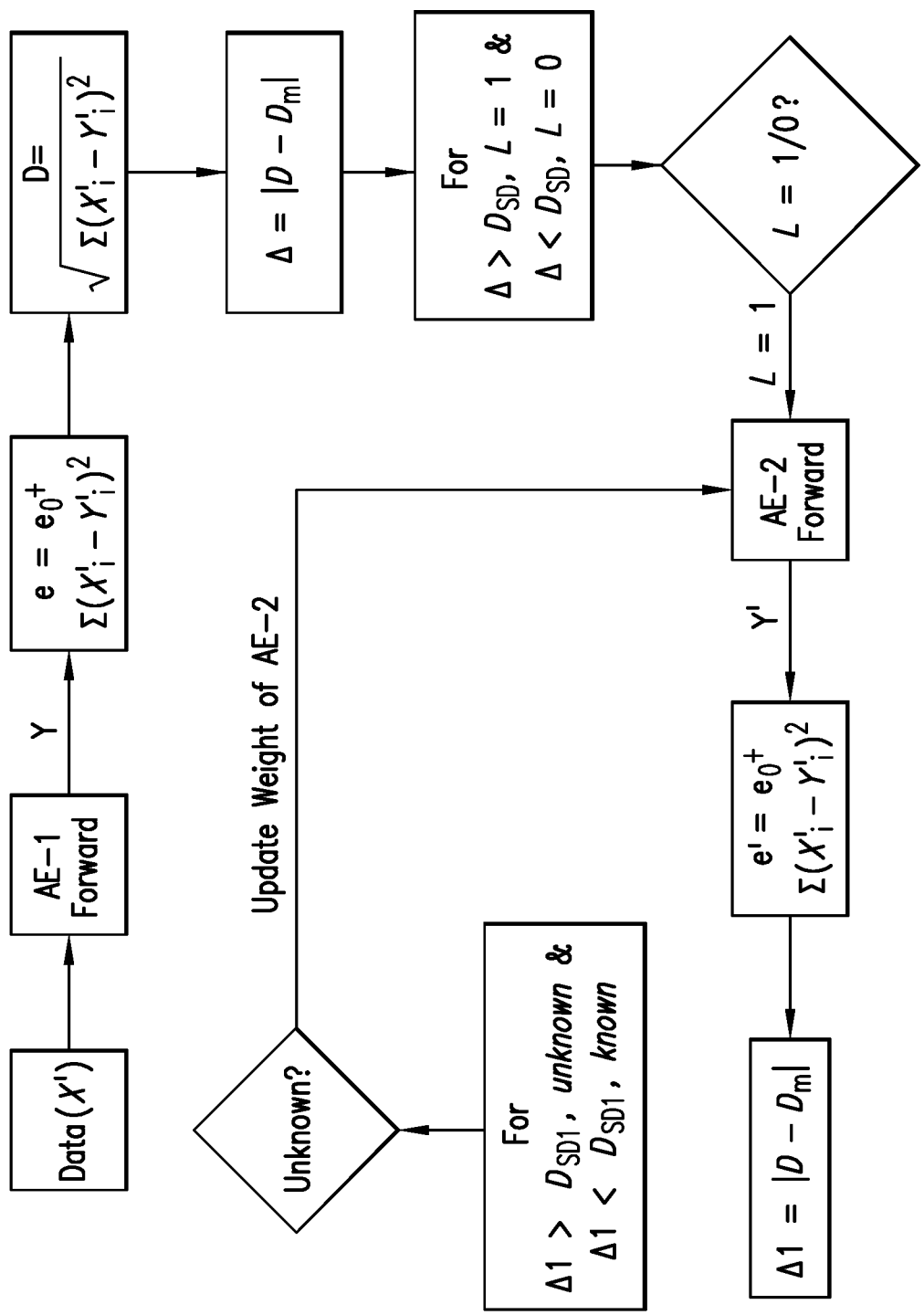
FIG. 9 is a schematic illustration of real-time intrusion detection algorithm executed by the real-time autoencoder configuration in FIG. 8.

FIG. 9 shows a real-time intrusion detection algorithm 900. An incoming packet is passed through the network, and the difference in vector distance 4 between the incoming packet and the mean distance $D_m$ is computed. This difference is compared with the standard deviation $D_{SD}$. If Δ is larger than $D_{SD}$, the data packet is determined to be malicious. Likewise, if Δ is smaller than $D_{SD}$, the packet is determined to be a normal packet. Using this thresholding technique, normal input data will induce a lower value for Δ than when input data is malicious since the network is trained with only normal packet data. If the network determines that a packet is abnormal, it is sent to the next system for learning, weights are continuously updated based on these incoming packets, which leads to more robust real-time anomaly detection. The detection accuracy is defined as in equation (14). Here, $N_F$ represents false detection and includes false positive and false negative cases. The value $N_s$ represents the total number of samples in the test set.

$$\text{Accuracy} = \frac{N_s - N_F}{N_s} \times 100\% \quad (14)$$

The autoencoder learns by updating a threshold value beyond which incoming data is considered an anomaly. The updating to this threshold requires some circuitry in addition to the memristor crossbars. One way to implement this threshold adjustment would be a CMOS digital logic design. Alternatively, the following circuits may be used to implement this threshold update in analog form.

Figure 10:
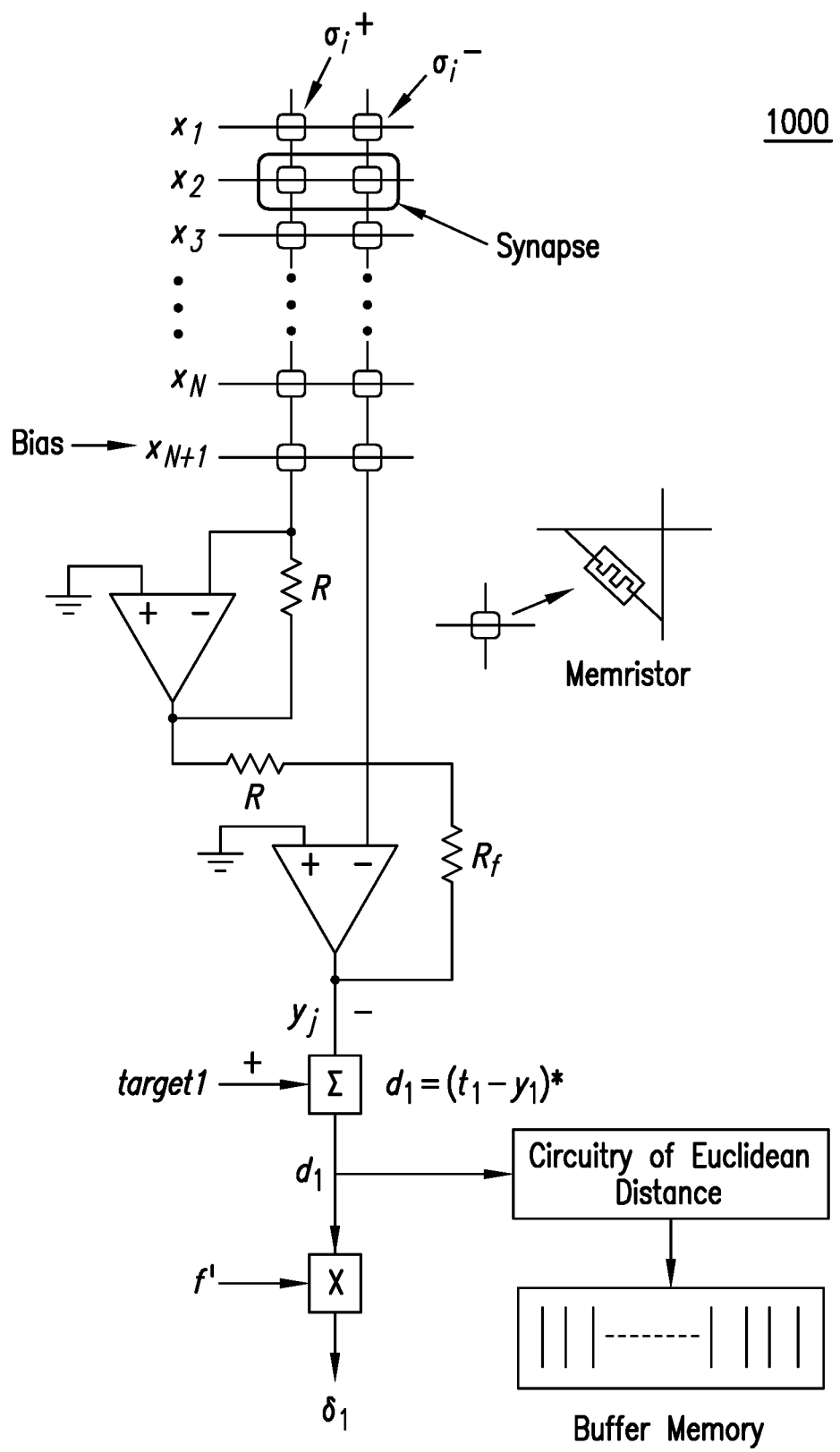
FIG. 10 is a schematic illustration of a single neuron circuit with error calculation and Euclidean distance calculation circuit blocks added to the real-time autoencoder configuration in FIG. 8.

FIG. 10 shows a single neuron circuit 1000 with error calculation and Euclidean distance calculation circuit blocks added. The Euclidean distance for each scan of the network will stored for each training samples while learning on chip. Then, the analog circuitry may compute mean and standard deviation for anomaly detection.

Figure 11:
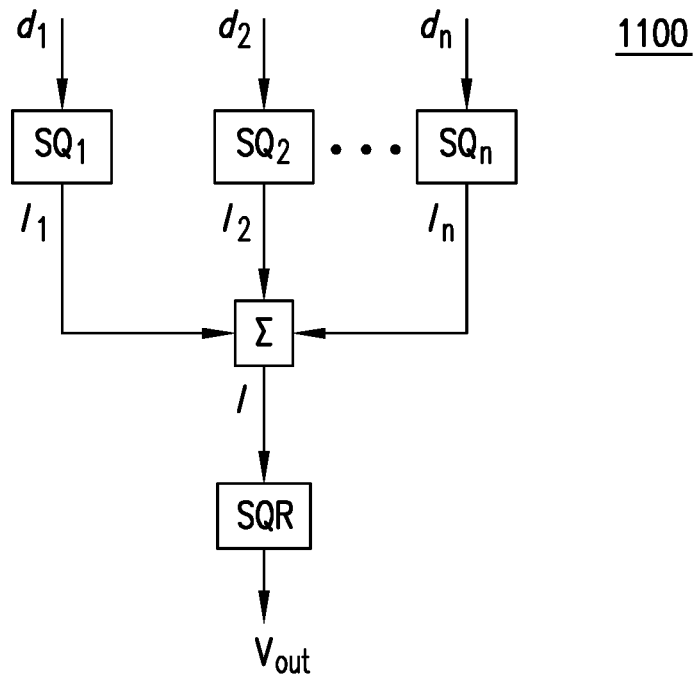
FIG. 11 is a schematic illustration of the method of the computation of Euclidean distance.
Figure 12:
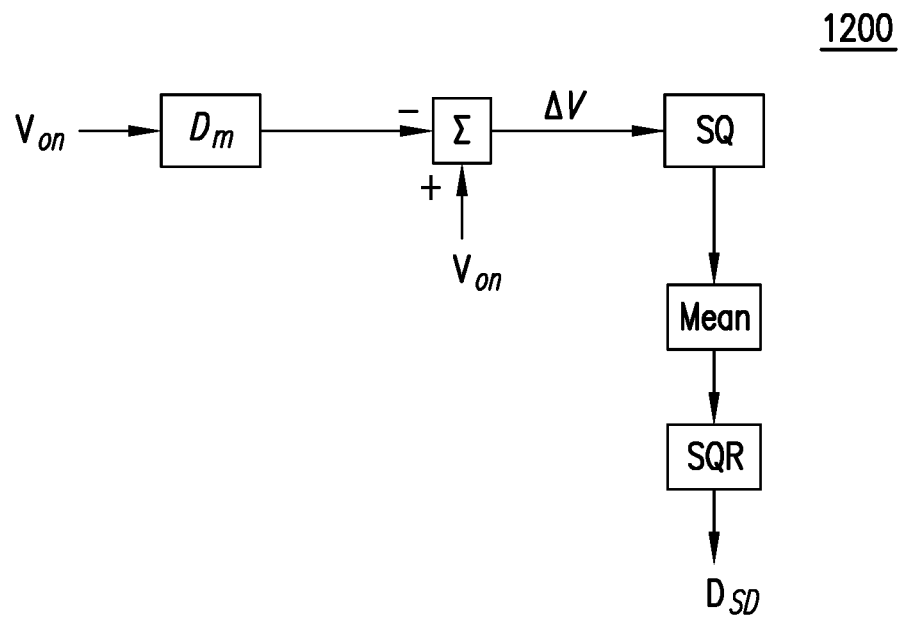
FIG. 12 is a schematic illustration of a standard deviation computation which is used to determine the anomaly threshold of the system for anomaly detection.
Figure 13:
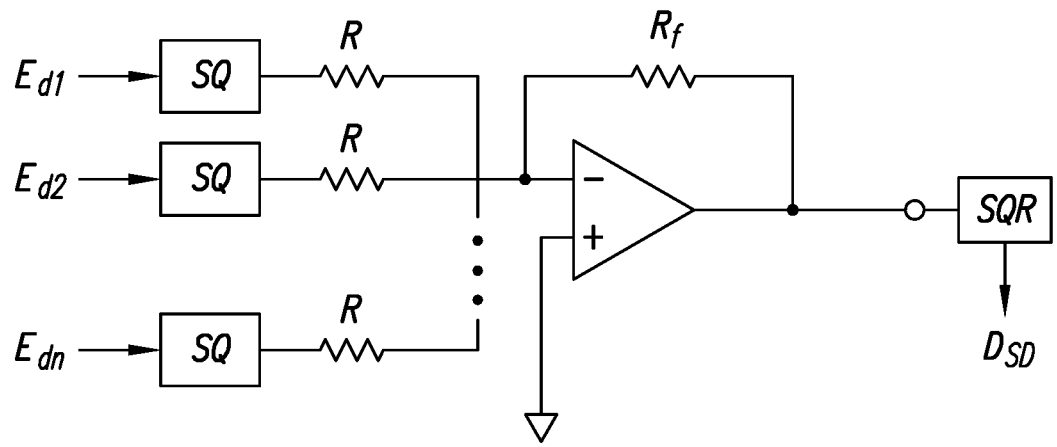
FIG. 13 is a schematic illustration of the standard deviation/threshold computation circuit where SQ represents a squaring circuit.

FIG. 11 shows the method of the computation of Euclidean distance 1100. FIG. 12 shows the block diagram of the standard deviation computation 1200 which is used to determine the anomaly threshold of the system for anomaly detection. FIG. 13 shows the standard deviation/threshold computation circuit 1300 where SQ represents a squaring circuit.

ART is a type of unsupervised neural network algorithm. ART is a fast and stable incremental learning algorithm with a relatively small memory requirement. Fast learning refers to the ability of the synaptic weight vectors to converge to their asymptotic values directly upon each input sample presentation. The ART algorithm has the ability to balance between plasticity and stability, which makes the algorithm more robust when obtaining new knowledge without suffering from catastrophic forgetting of prior learned knowledge. ART can be scalable for large-sized datasets and is capable of processing noisy data.

Figure 14:
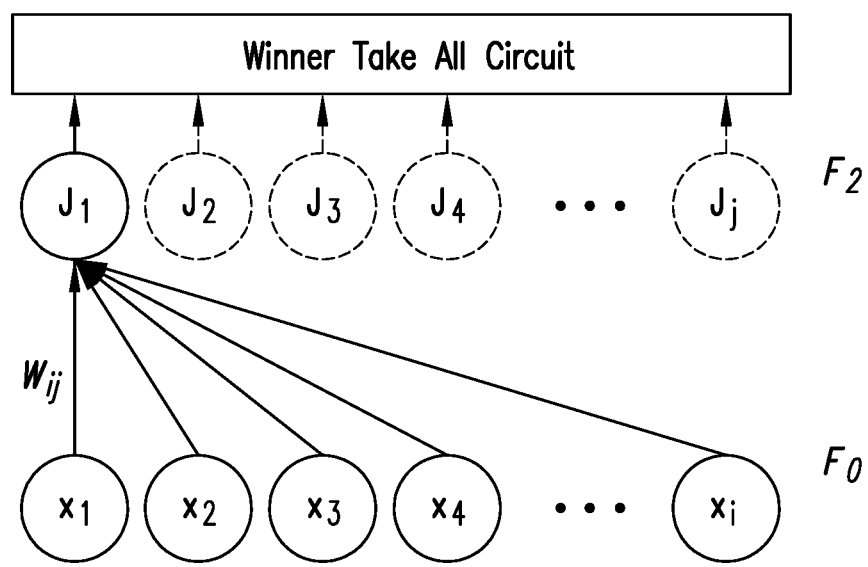
FIG. 14 is a schematic illustration of the underlying ART architecture with two layers of neurons.

FIG. 14 presents the underlying ART architecture 1400 with two layers of neurons. The first layer $F_0$ is known as the comparison layer, and $F_2$ is the recognition layer. Once an input is fed to the network, a predefined vigilance parameter identifies the possible candidate(s) from the nodes at the $F_2$ layer. The winner take all (WTA) method results in choosing only the winning neuron when updating the synaptic weight. In the ART network, the $F_2$ layer is initialized with a single output node $J_1$ (the circle with the solid line in the $F_2$ layer). The node with the solid line indicates the initial node and faded nodes indicate the possible nodes to be activated once the active node will discriminate with the incoming sample(s). If the next instances don't match with the first node, then the successive node (or nodes) will be initialized and learn the respective categories. The output of the $F_2$ layer is represented by equation (15).

$$DP_j = \Sigma w \cdot x \quad (15)$$

The activation function of the neurons is described by equation (16), which is known as the choice function. The choice function scales the excitatory signal with the net magnitude of the neural weight. Here, α is a small constant.

$$T_j = \frac{DP_j}{\alpha + |w|} \quad (16)$$

The matching parameter is equal to the scaled value of the dot product for an incoming sample divided by the norm of the input signal, as described as equation (17). The matching function ($MF_j$) searches for the possible winning neurons compared with a predefined threshold called the vigilance parameter (0<ρ<1), as in equation (18). If $MF_j$ does not satisfy the vigilance parameter, then the output becomes −1, and ART creates a new neuron with a random weight and assigns the instance belong to the newly created neuron.

$$MF_j = \frac{DP_j}{|x|} \quad (17)$$

$$\text{Output} = \begin{cases} T_j, \text{ if } MFj > \rho \\ -1, \text{ otherwise} \end{cases} \quad (18)$$

The ART updates the synaptic weight only for the winning neuron, which is determined by the maximum value of T according to the equation (19). The winning neuron j is updated according to equation (20). Here, β is the learning rate and is bounded accordingly: 0<β≤1.

$$w_{winner} = \max(T_j) \quad (19)$$

$$w_{new} = w_{old}^j(1-\beta) + \beta x \quad (20)$$

Figure 15:
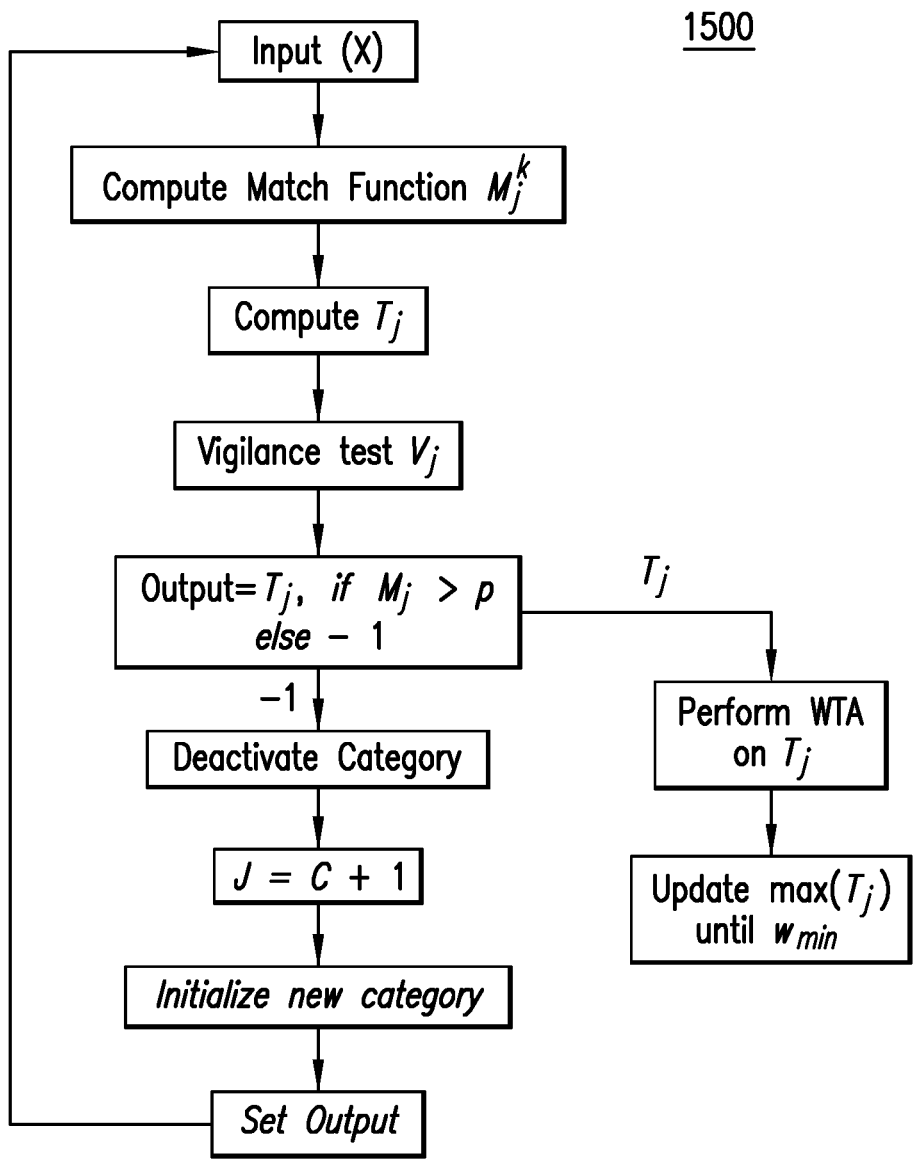
FIG. 15 is a flowchart of the ART neural network.

FIG. 15 shows the flowchart 1500 of the ART neural network. The vigilance parameter scans the matching function to identify the possible winner neurons, and the WTA finds the winning neuron, which exhibits the maximum choice function. The ART system updates the weight for only the winning neuron until it reaches $w_{min}$. If there is no winning neuron, then the output is set to −1, and the process deactivates the category and creates a new group and initializes a new node to set the output.

Figure 16:
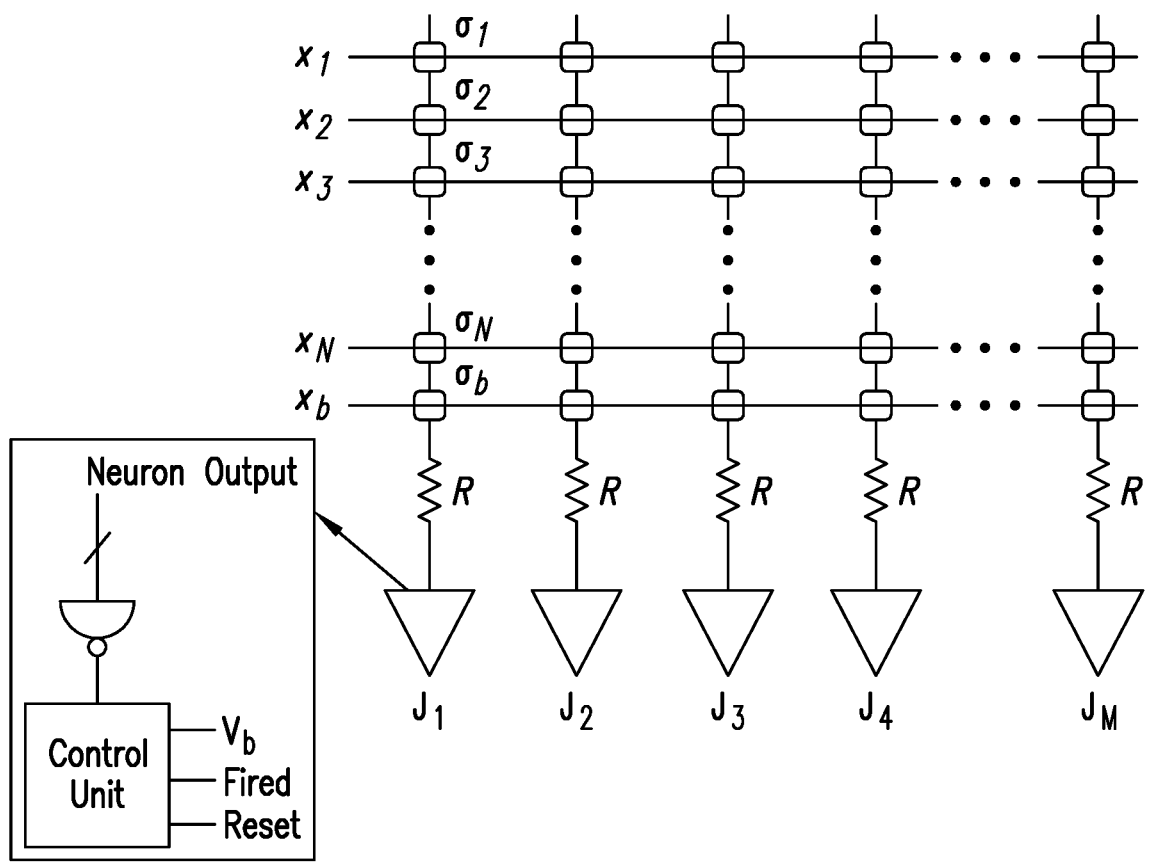
FIG. 16 is a schematic illustration of the memristor crossbar for the ART implementation.

FIG. 16 presents the memristor crossbar 1600 for the ART implementation. Each column represents a neuron with a CMOS control circuit, as shown in the inset of FIG. 16. The detailed control unit 1700 is presented in FIG. 17. There is a capacitor connected at the bottom of each neuron. The role of the capacitor is to accumulate the charges for any applied potential.

Figure 18:
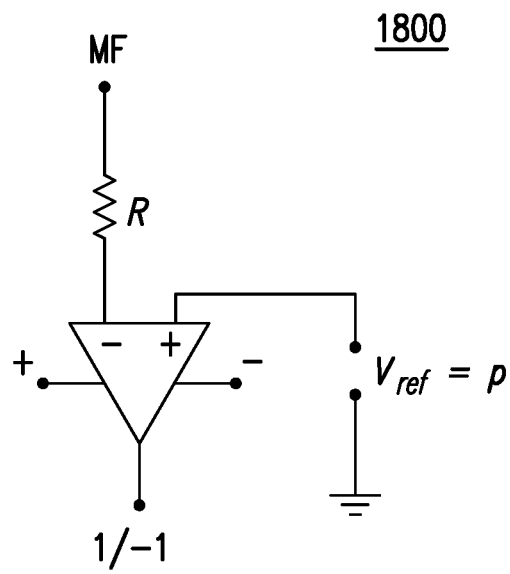
FIG. 18 is a schematic illustration of a comparator configuration.

For this particular implementation of ART, the capacitor starts to accumulate the charges after performing the vigilance test on the neurons. For the vigilance test, a comparator configuration 1800 as in FIG. 18 is implemented. The comparator compares the magnitude of the matching function of equation (17) with the vigilance parameter. If $MF_j > \rho$, then the respective capacitor starts charging, otherwise the network switches to a new neuron and initializes it with a random weight.

At the steady-state, the potential across the capacitor is a normalized dot product of the input x and the respective synaptic weight a as R is a high resistance. For zero bias, the accumulated voltage is described by the equation (21). Here, $\sigma_b$ is a constant value and represents $\alpha$ in equation (16). Equation (16) is analogous to equation (21) which describes the calculation of $V_c$ for an input network packet with 41 features.

$$V_c = x_1\sigma_1 + x_2\sigma_2 + x_2\sigma_2 + \ldots + x_{41}\sigma_{41} + 0 \cdot \sigma_b / \Sigma_{k=1}^{41} \sigma_k + \sigma_b \quad (21)$$

Figure 17:
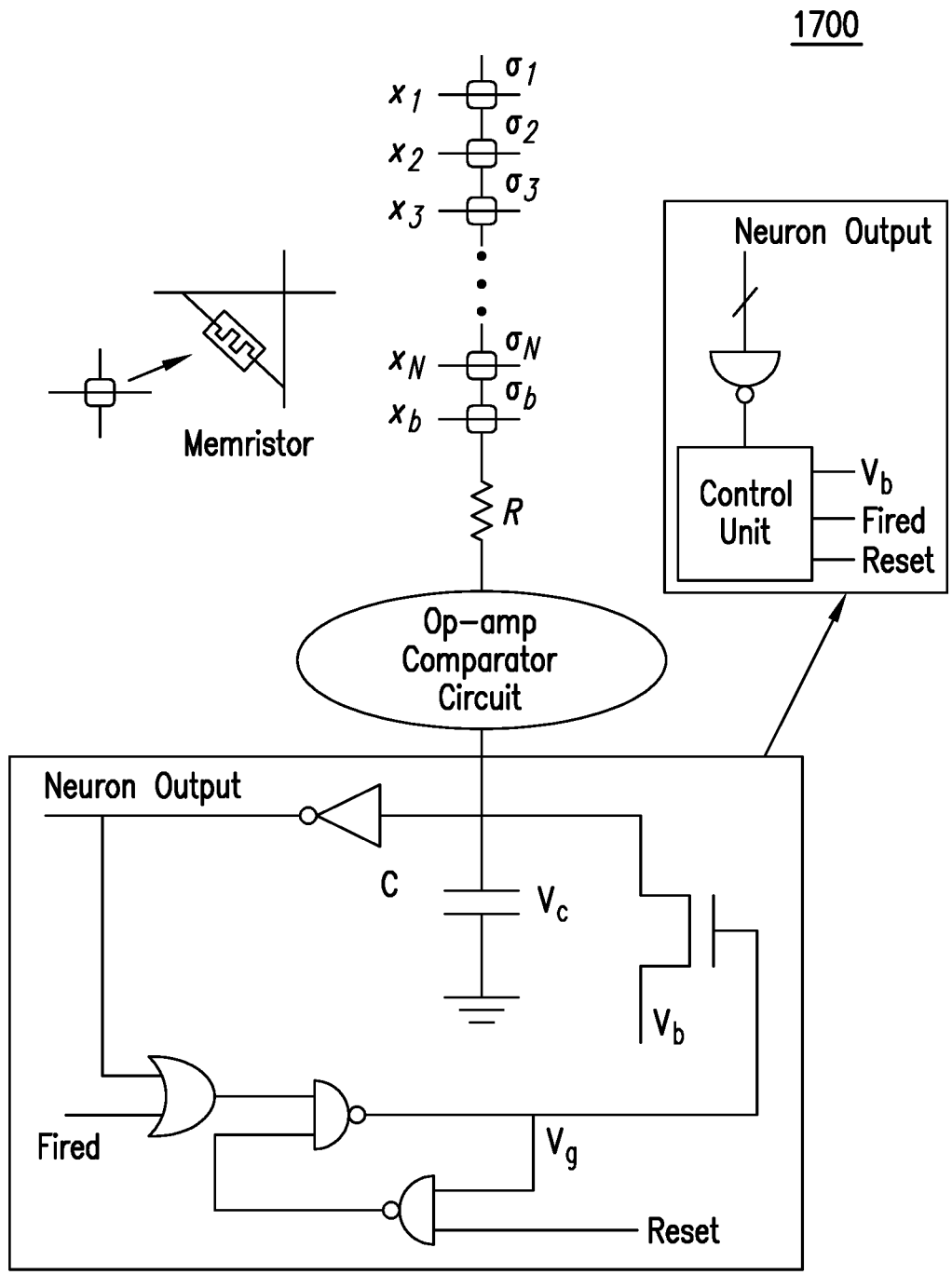
FIG. 17 is a schematic illustration of a single neuron with an op-amp comparator and a capacitor for charge accumulation.

FIG. 17 shows a single neuron with an op-amp comparator and a capacitor for charge accumulation. The capacitor starts to accumulate if the matching function satisfies the vigilance parameter according to equation (18). After turning ON the switches of candidate neurons, the capacitors begin to accumulate. The charging rate will be faster for the neuron with the highest column voltage according to the equation (18). The charging time is determined from the RC relationship as described in equation (22). Here, R is a high resistance, C is the capacitance of the capacitor, and $V_c$ is the voltage drop across the capacitor. The winning neuron is decided where the first charge accumulating column capacitor voltage to crosses the threshold voltage $V_t$.

$$t_c = RC[\log(V_c/V_c - V_t)] \quad (22)$$

A CMOS inverter is used to detect the moment when the voltage drop across the capacitor passes the $V_t$. The average timing required to find a winning neuron is few nanoseconds. Once the winning neuron crosses the threshold voltage, $V_g$ switches from low to high, which indicates the individual neuron is fired, and the neuron updates the weight. It is crucial to restrict other neurons from firing after the winning neuron fires. The output of the NAND operation goes to high if any neuron output switches from high to low. This neuron firing signal is perpetual; thus, no other neuron can switch $V_g$ to high, and the updating of any other neuron can be deterred.

Figure 20:
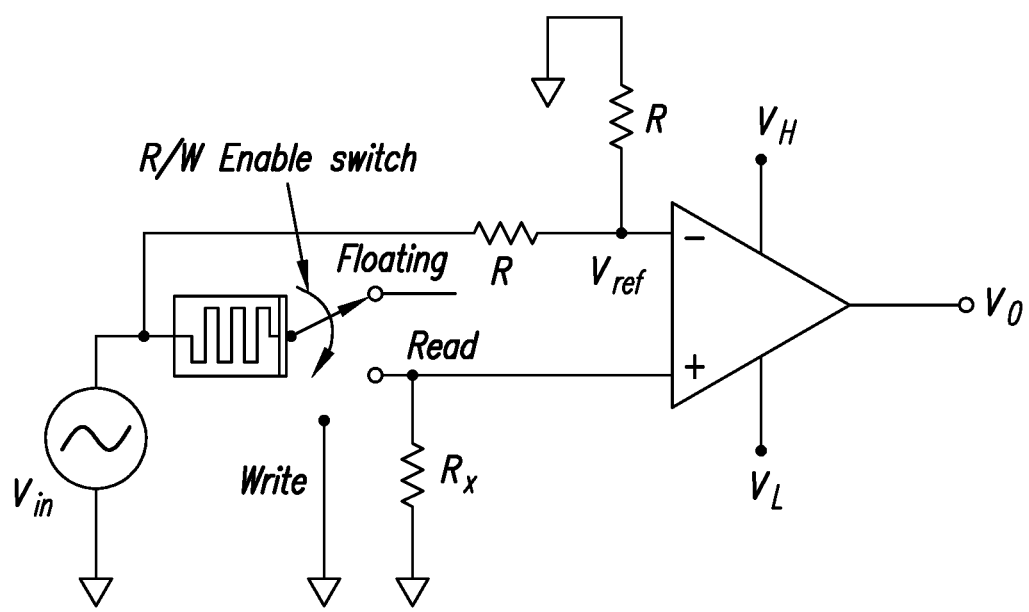
FIG. 20 is a schematic illustration of the reading and writing circuit for the memristor devices.

The weight update is performed according to equation (20). From this equation, the system needs to read the existing conductance state of the device. FIG. 20 shows the reading and writing circuit 2000 for the memristor devices.

Figure 19:
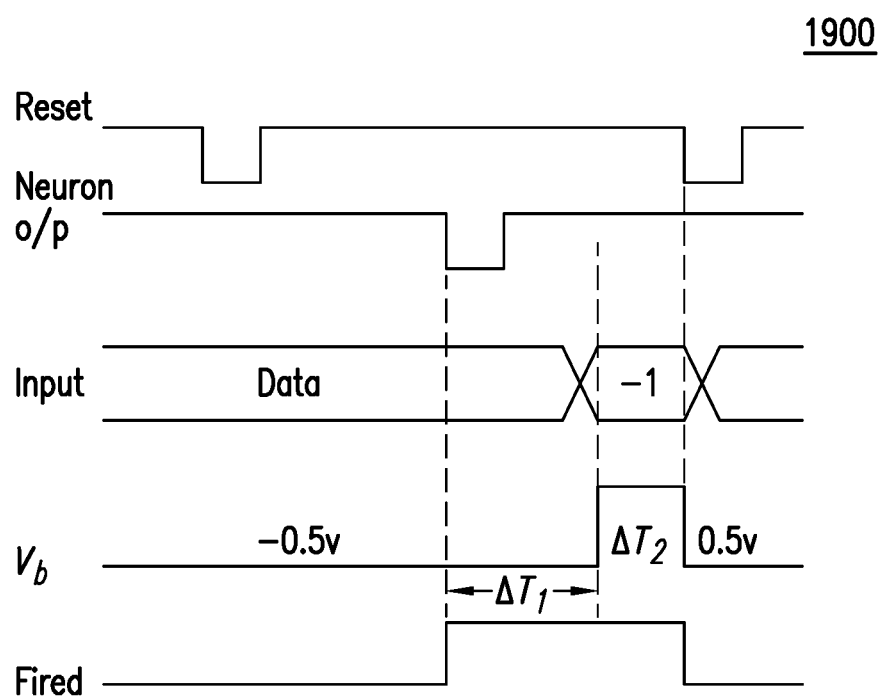
FIG. 19 is a schematic illustration of the timing and amplitude of the signals during the training period.

In FIG. 19, the timing and amplitude of the signals during the training period are described. At a particular time t, the jth neuron is fired. Just after this firing, $V_g$ of jth neuron transits from low to high, which turns on the NMOS transistor and the capacitor discharges. Ultimately, the $V_b$ becomes −0.5V on the fired neuron, and the memristors that have high inputs have a voltage across them that exceeds the threshold voltage. Therefore, the conductance of these memristors increases until $t + \Delta t_1$.

The algorithm allows for a new output node once it finds an unknown or anomaly in the network according to the vigilance parameter. The magnitude of the vigilance parameter plays a vital role in the initialization of a new node. The network packets are presented to the ART network randomly without any label only once, and the same packets are not presented multiple times. Despite running multiple epochs or learning cycles, the system utilizes one pass fast learning. The model performs clustering-based anomaly detection by focusing on the point anomalies where an individual data instance may be considered as anomalous with respect to the rest of the data. A profile of an incoming packet is assigned to a neuron, then deviation from this profile regarded as anomalous to the neuron, and the system allows for the creation of a new neuron for this type.

It is to be appreciated that the Detailed Description section, and not the Abstract section, is intended to be used to interpret the claims. The Abstract section can set forth one or more, but not all exemplary embodiments, of the present disclosure, and thus, is not intended to limit the present disclosure and the appended claims in any way.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in art. The invention in its broader aspects is therefore not limited to the specific details, representative apparatus and method and illustrative examples shown and described. Accordingly, departures may be made from such details without departing from the scope of the general inventive concept.

What is claimed is:

1. An analog neuromorphic circuit that implements a plurality of resistive memories, comprising:
   a first memristor crossbar configuration that includes a first plurality of resistive memories that is configured to provide a first plurality of resistance values to each corresponding input voltage from a plurality of input voltages applied to the first memristor crossbar configuration to generate a first plurality of output voltages, wherein the first plurality of output voltages is compressed from the plurality of input voltages;
   a second memristor crossbar configuration that includes a second plurality of resistive memories that is configured to provide a second plurality of resistance values to each corresponding output voltage from the first plurality of output voltages generated from the first memristor crossbar configuration and applied to the second memristor crossbar configuration to generate a second plurality of output voltages, wherein the second plurality of output voltages is decompressed from the first plurality of output voltages; and
   a controller configured to:
      compare the second plurality of output voltages to the plurality of input voltages to determine if the second plurality of output voltages is within a threshold of the plurality of input voltages, and
      generate an alert when the second plurality of output voltages exceeds the threshold from the plurality of input voltages thereby indicating that input data associated with the plurality of input voltages has not been previously input into the analog neuromorphic circuit.

2. The analog neuromorphic circuit of claim 1, wherein each resistance value from the first plurality of resistance values is mapped to a corresponding weighted value that is a non-binary value included in a first weighted matrix and each resistance value from the second plurality of resistance values is mapped to a corresponding weighted from a corresponding weighted value that is a non-binary value included in a second weighted matrix.

3. The analog neuromorphic circuit of claim 2, wherein the controller is further configured to:
   compare the second plurality of output voltages to the plurality of input voltages after the first weighted matrix is applied to the first memristor crossbar configuration in compressing the plurality of input voltages and the second weighted matrix is applied to the second memristor crossbar configuration in decompressing the second plurality of output voltages from the first plurality of output voltages, wherein the first weighted matrix is identical to the second weighted matrix; and generate the alert when the second plurality of output voltages exceeds the threshold from the plurality of input voltages after the first weighted matrix is applied to the first memristor crossbar configuration and the second weighted matrix is applied to the second memristor crossbar configuration thereby indicating that the application of the first weighted matrix and the second weighted matrix that are identical failed to generate the second plurality of output voltages that are within the threshold of the plurality of input voltages.

4. The analog neuromorphic circuit of claim 1, wherein each first output voltage value associated with the first plurality of output voltages is generated from a dot product operation conducted by the first memristor crossbar configuration and each second output voltage value associated with the second plurality of output voltages is generated from a dot product operation conducted by the second memristor crossbar configuration.

5. The analog neuromorphic circuit of claim 1, wherein the first memristor crossbar configuration that includes the first plurality of resistive memories that is further configured to:

provide the first plurality of resistance values to each corresponding output voltage from the first plurality of output voltages that is compressed from the plurality of input voltages that is applied to the first memristor crossbar configuration to generate the second plurality of output voltages that is decompressed from the first plurality of output voltages, wherein the compression of the plurality of input voltages and the decompression of the first plurality of output voltages to generate the second plurality of output voltages is conducted by a single memristor crossbar configuration.

6. The analog neuromorphic circuit of claim 1, further comprising:

a second analog neuromorphic circuit that includes a third plurality of resistive memories that is configured to provide a third plurality of resistance values to each corresponding input voltage from the plurality of input voltages when the second plurality of output voltages exceeds the threshold from the plurality of input voltages to train the second analog neuromorphic circuit to identify the input data associated with the plurality of input voltages.

7. The analog neuromorphic circuit of claim 6, wherein the controller is further configured to:

provide the plurality of input voltages to the second analog neuromorphic circuit when the second plurality of output voltages exceeds the threshold from the plurality of input voltages thereby indicating that the plurality of input voltages has not been previously identified and the training of the second analog neuromorphic circuit to identify the input data associated with the plurality of input voltages is required.

8. The analog neuromorphic circuit of claim 7, wherein the plurality of input voltages is converted to an input eigenvector, the first plurality of output voltages is converted to a first output eigenvector, and the second plurality of output voltages is converted to a second output eigenvector.

9. The analog neuromorphic circuit of claim 8, wherein the controller is further configured to:

compare the second output eigenvector to the input eigenvector to determine if a difference between the second output eigenvector and the input eigenvector deviates beyond an error threshold, wherein the deviation beyond the error threshold by the second output eigenvector and the input eigenvector is indicative that the input data associated with the input voltages has not been previously identified; and generate the alert when the difference between the second output eigenvector and the first input eigenvector exceeds the error threshold.

10. The analog neuromorphic circuit of claim 9, wherein the controller is further configured to:

square each difference between each output voltage value that corresponds to each second output voltage from the second plurality of output voltages and each corresponding input voltage value that corresponds to each input voltage to generate a square rooted difference between each output voltage value and each corresponding input voltage value;

square root a sum of each corresponding square rooted difference between each output voltage value and each corresponding input voltage to generate a root squared error for the analog neuromorphic circuit;

compare the root squared error to a standard deviation as the error threshold, wherein the standard deviation is previously determined as the error threshold that when the root squared error exceeds the standard deviation is indicative that the input data associated with the input voltages has not been previously identified; and provide the plurality of input voltages to the second analog neuromorphic circuit when the root squared error exceeds the standard deviation of the error threshold thereby indicating that the plurality of input voltages has not been previously identified and the training of the second analog neuromorphic circuit to identify the input data associated with the plurality of input voltages is required.

11. A method for implementing a plurality of resistive memories into an autoencoder to compress and then decompress input data to determine if the input data has been previously identified, comprising:

providing a first plurality of resistance values by a first plurality of resistive memories to each corresponding input voltage from a plurality of input voltages applied to a first memristor crossbar configuration generating a first plurality of output voltages, wherein the first plurality of output voltages is compressed from the plurality of input voltages;

providing a second plurality of resistance values by a second plurality of resistive memories to each corresponding output voltage from the first plurality of output voltages generated from the first memristor crossbar configuration and applied to the second memristor crossbar configuration to generate a second plurality of output voltages, wherein the second plurality of output voltages is decompressed from the first plurality of output voltages;

comparing the second plurality of output voltages to the plurality of input voltages to determine if the second plurality of output voltages is within a threshold of the plurality of input voltages; and generate an alert when the second plurality of output voltages exceeds the threshold from the plurality of input voltages thereby indicating that input data associated with the plurality of input voltages has not been previously input into the analog neuromorphic circuit.

12. The method of claim 11, further comprising:
mapping each resistance value from the first plurality of resistance values to a corresponding weighted value that is a non-binary value included in a first weighted matrix; and
mapping each resistance value from the second plurality of resistance values to a corresponding weighted value that is a non-binary value included in a second weighted matrix.

13. The method of claim 12, further comprising:
comparing the second plurality of output voltages to the plurality of input voltages after the first weighted matrix is applied to the first memristor crossbar configuration in compressing the plurality of input voltages and the second weighted matrix is applied to the second memristor crossbar configuration in decompressing the second plurality of output voltages from the first plurality of output voltages, wherein the first weighted matrix is identical to the second weighted matrix; and
generating the alert when the second plurality of output voltages exceeds the threshold from the plurality of input voltages after the first weighted matrix is applied to the first memristor crossbar configuration and the second weighted matrix is applied to the second memristor crossbar configuration thereby indicating that the application of the first weighted matrix and the second weighted matrix that are identical failed to generate the second plurality of output voltages that are within the threshold of the plurality of input voltages.

14. The method of claim 11, further comprising:
generating each first output voltage value associated with the first plurality of output voltages from a dot product operation conducted by the first memristor crossbar configuration; and
generating each second output voltage value associated with the second plurality of output voltages from a dot product operation conducted by the second memristor crossbar configuration.

15. The method of claim 11, further comprising:
providing the first plurality of resistance values to each corresponding output voltage from the first plurality of output voltages that is compressed from the plurality of input voltages that is applied to the first memristor crossbar configuration to generate the second plurality of output voltages that is decompressed from the first plurality of output voltages, wherein the compression of the plurality of input voltages and the decompression of the first plurality of output voltages to generate the second plurality of output voltages is conducted by a single memristor crossbar configuration.

16. The method of claim 11, further comprising:
providing a third plurality of resistance values by a third plurality of resistive memories to each corresponding input voltage from the plurality of input voltages applied to a second analog neuromorphic circuit when the second plurality of output voltages exceeds the threshold from the plurality of input voltages to train the second analog neuromorphic circuit to identify the input data associated with the plurality of input voltages.

17. The method of claim 16, further comprising:
providing the plurality of input voltages to the second analog neuromorphic circuit when the second plurality of output voltages exceeds the threshold from the plurality of input voltages thereby indicating that the plurality of input voltages has not been previously identified and the training of the second analog neuromorphic circuit to identify the input data associated with the plurality of input voltages is required.

18. The method of claim 17, further comprising:
converting the plurality of input voltages into an input eigenvector, the first plurality of output voltages to a first output eigenvector, and the second plurality of output voltages to a second output eigenvector.

19. The method of claim 18, further comprising:
comparing the second output eigenvector to the input eigenvector to determine if a difference between the second output eigenvector and the input eigenvector deviates from an error threshold, wherein the deviation beyond the error threshold by the second output eigenvector and the input eigenvector is indicative that the input data associated with the input voltages has not been previously identified; and
generating the alert when the difference between the second output eigenvector and the first input eigenvector exceeds the error threshold.

20. The method of claim 19, further comprising:
squaring each difference between each output voltage value that corresponds to each second output voltage from the second plurality of output voltages and each corresponding input voltage value that corresponds to each input voltage to generate a square rooted difference between each output voltage value and each corresponding input voltage value;
square rooting a sum of each square rooted difference between each output voltage value and each corresponding input voltage to generate a root squared error for the analog neuromorphic circuit;
comparing the root squared error to a standard deviation as the error threshold, wherein the standard deviation is previously determined as the error threshold that when the root squared error exceeds the standard deviation is indicative that the input data associated with the input voltages has not been previously identified; and
providing the plurality of input voltages to the second analog neuromorphic circuit when the root squared error exceeds the standard deviation of the error threshold thereby indicating that the plurality of input voltages has not been previously identified and the training of the second analog neuromorphic circuit to identify the input data associated with the plurality of input voltages is required.

* * * * *